United States Patent
Takata

(10) Patent No.: US 12,512,816 B2
(45) Date of Patent: Dec. 30, 2025

(54) HIGH FREQUENCY FILTER AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 164 days.

(21) Appl. No.: 18/584,611

(22) Filed: Feb. 22, 2024

(65) Prior Publication Data

US 2024/0195389 A1    Jun. 13, 2024

Related U.S. Application Data

(63) Continuation of application No. PCT/JP2022/032489, filed on Aug. 30, 2022.

(30) Foreign Application Priority Data

Sep. 6, 2021   (JP) ................. 2021-145017

(51) Int. Cl.
*H03H 9/64*     (2006.01)
*H03H 9/54*     (2006.01)
*H03H 9/72*     (2006.01)

(52) U.S. Cl.
CPC .......... *H03H 9/6403* (2013.01); *H03H 9/542* (2013.01); *H03H 9/6483* (2013.01); *H03H 9/725* (2013.01)

(58) Field of Classification Search
CPC .......... H03H 9/25; H03H 9/725; H03H 9/145; H03H 9/64; H03H 9/6403; H03H 9/72; H03H 9/542; H03H 9/6483
See application file for complete search history.

(56) References Cited

U.S. PATENT DOCUMENTS

2018/0131348 A1   5/2018   Takahashi
2018/0131349 A1*  5/2018   Takata ............... H03H 9/6483
(Continued)

FOREIGN PATENT DOCUMENTS

JP    2018074539 A    5/2018
JP    2018078489 A    5/2018
(Continued)

OTHER PUBLICATIONS

International Search Report in PCT/JP2022/032489, mailed Nov. 22, 2022, 3 pages.

(Continued)

*Primary Examiner* — Quan Tra
*Assistant Examiner* — Anh-Quan Tra
(74) *Attorney, Agent, or Firm* — Keating & Bennett, LLP

(57) ABSTRACT

A high frequency filter includes a filter circuit portion on a first path between first and second signal electrodes, and an additional circuit portion on a second path parallel or substantially parallel to at least a portion of the first path. The filter circuit portion includes series arm resonators, parallel arm resonators, and an inductor on a path connecting a portion or all of parallel arm resonators and a ground. Acoustic wave resonators of the additional circuit portion include first and second electrodes. The first electrodes are connected to the second path. The second electrodes are connected to a connection conductor on a path connecting a portion or all of the parallel arm resonators and the inductor.

12 Claims, 18 Drawing Sheets

(56) References Cited

U.S. PATENT DOCUMENTS

| | | |
|---|---|---|
| 2018/0152191 A1* | 5/2018 | Niwa .................... H01P 1/2005 |
| 2019/0245516 A1 | 8/2019 | Taguchi et al. |
| 2020/0295734 A1 | 9/2020 | Urata |
| 2021/0028764 A1* | 1/2021 | Takata .................... H03H 9/205 |
| 2023/0080910 A1 | 3/2023 | Takata |

FOREIGN PATENT DOCUMENTS

| | | |
|---|---|---|
| KR | 20210011330 A | 2/2021 |
| WO | 2018088153 A1 | 5/2018 |
| WO | 2019107280 A1 | 6/2019 |
| WO | 2021149332 A1 | 7/2021 |

OTHER PUBLICATIONS

Written Opinion in PCT/JP2022/032489, mailed Nov. 22, 2022, 4 pages.

* cited by examiner

HIGH FREQUENCY FILTER AND MULTIPLEXER

CROSS REFERENCE TO RELATED APPLICATIONS

This application claims the benefit of priority to Japanese Patent Application No. 2021-145017, filed on Sep. 6, 2021, and is a Continuation Application of PCT Application No. PCT/JP2022/032489, filed on Aug. 30, 2022. The entire contents of each application are hereby incorporated herein by reference.

BACKGROUND OF THE INVENTION

1. Field of the Invention

The present invention relates to high frequency filters and multiplexers each including a high frequency filter.

2. Description of the Related Art

In the related art, a high frequency filter that has a predetermined frequency band as a pass band is known. As an example of this type of high frequency filter, Japanese Unexamined Patent Application Publication No. 2018-74539 discloses a high frequency filter including a filter circuit portion having a series arm resonator and a parallel arm resonator, and an additional circuit portion connected parallel to the filter circuit portion. An inductor is provided between the parallel arm resonator and a ground. In the high frequency filter, unnecessary waves outside of the pass band are canceled by using the additional circuit portion.

For example, in the above-described high frequency filter, an attenuation amount outside the pass band, such as a second harmonic wave, can be secured by using an attenuation pole generated in an LC resonance circuit formed by the parallel arm resonators and an inductor. However, in order to sufficiently secure the attenuation amount, an inductor having a large inductance value is required. When the inductance value is increased, a size of the inductor is increased, so that it is difficult to reduce a size of the high frequency filter.

SUMMARY OF THE INVENTION

Example embodiments of the present invention provide high frequency filters which are each able to obtain an attenuation amount outside a pass band and reduce an inductance value of an inductor provided between a parallel arm resonator and a ground.

A high frequency filter according to an example embodiment of the present invention includes a piezoelectric substrate, a first signal electrode and a second signal electrode on the piezoelectric substrate, a filter circuit portion provided on a first path between the first signal electrode and the second signal electrode, and an additional circuit portion provided on a second path parallel to at least a portion of the first path, in which the filter circuit portion includes one or more series arm resonators provided on the first path, one or more parallel arm resonators provided on a path connecting the first path and a ground, and an inductor provided on a path connecting the ground and a portion or all of parallel arm resonators among the one or more parallel arm resonators, the additional circuit portion includes an acoustically coupled resonator including a plurality of acoustic wave resonators, each of the plurality of acoustic wave resonators includes a first electrode and a second electrode facing the first electrode, the first electrode is connected to the second path, and the second electrode is connected to a connection conductor on a path connecting the portion or all of parallel arm resonators and the inductor.

Furthermore, a multiplexer according to an example embodiment of the present invention includes a high frequency filter according to an example embodiment of the present invention, and another filter with a pass band different from a pass band of the high frequency filter.

According to example embodiments of the present invention, it is possible to obtain the attenuation amount outside the pass band, and to reduce the inductance value of the inductor provided between the parallel arm resonator and the ground.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
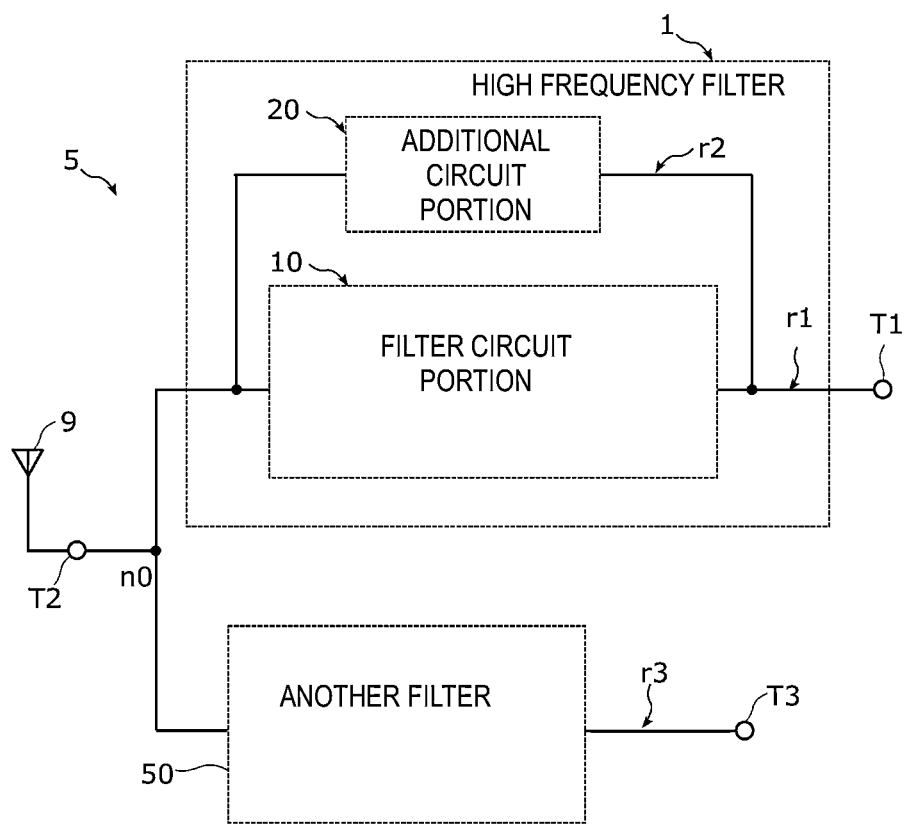
FIG. 1 is a circuit configuration diagram of a multiplexer including a high frequency filter according to an example embodiment of the present invention.

Hereinafter, example embodiments of the present invention will be described in detail with reference to example embodiments and drawings. All of the example embodiments described below describe comprehensive or specific examples. Numerical values, shapes, materials, components, the arrangement and connection configuration of the components, and so forth that are described in the following example embodiments are merely examples and are not intended to limit the scope of the present invention. Among the components in the following example embodiments, a component that is not described in an independent claim is described as an optional component. Furthermore, the sizes or size ratios of components illustrated in drawings are not necessarily exact. In the drawings, configurations that are the same or substantially the same are denoted by the same reference numerals, and a repeated description thereof is omitted or simplified in some cases. In addition, in the following example embodiments, the expression "connected" includes not only a case of being directly connected, but also a case of being electrically connected via another element or the like.

Example Embodiment

Configuration of Multiplexer

A configuration of a multiplexer including a high frequency filter according to an example embodiment of the present invention will be described with reference to FIG. 1.

FIG. 1 is a circuit configuration diagram of a multiplexer 5 including a high frequency filter 1 according to an example embodiment of the present invention. An antenna element 9 is also illustrated in FIG. 1.

The multiplexer 5 is, for example, a demultiplexer or a multiplexer including a plurality of high frequency filters with different pass bands. As illustrate in FIG. 1, the multiplexer 5 preferably includes the high frequency filter 1 including a filter circuit portion 10 and an additional circuit portion 20, and another filter 50. In addition, the multiplexer 5 preferably includes a first signal terminal T1 connected to the high frequency filter 1, a second signal terminal T2 connected to both the high frequency filter 1 and another filter 50, and a third signal terminal T3 connected to another filter 50.

The first signal terminal T1 is one terminal to input and output a high frequency signal to and from the high frequency filter 1. For example, the first signal terminal T1 is connected to an RF signal processing circuit (not illustrated) with an amplifier circuit or the like (not illustrated) interposed therebetween.

The second signal terminal T2 is the other terminal to input and output a high frequency signal to and from the high frequency filter 1, or is one terminal to input and output a high frequency signal to and from another filter 50. The second signal terminal T2 is a common terminal of the high frequency filter 1 and another filter 50. The second signal terminal T2 includes one branched path that is connected to the high frequency filter 1 with a node n0 between the high frequency filter 1 and another filter 50 as a branch point, and the other branched path that is connected to another filter 50. The node is a location where a path branches from another path. For example, the second signal terminal T2 is connected to the antenna element 9.

The third signal terminal T3 is the other terminal to input and output a high frequency signal to and from another filter 50. For example, the third signal terminal T3 is preferably connected to an RF signal processing circuit (not illustrated) with an amplifier circuit or the like (not illustrated) interposed therebetween.

The high frequency filter 1 is located on a first path r1 connecting the first signal terminal T1 and the second signal terminal T2. The high frequency filter 1 includes the filter circuit portion 10 and the additional circuit portion 20 additionally connected to the filter circuit portion 10.

The filter circuit portion 10 is a filter that has a predetermined frequency band as a pass band. The filter circuit portion 10 is preferably, for example, a transmission filter that has an uplink frequency band (transmission band) as a pass band, and is set, for example, to have a lower pass band than that of another filter 50.

The additional circuit portion 20 is a circuit to cancel unnecessary waves outside the pass band of the filter circuit portion 10. The additional circuit portion 20 is provided on a second path r2 connected parallel to at least a portion of the first path r1.

Another filter 50 is located on a third path r3 connecting the second signal terminal T2 and the third signal terminal T3. Another filter 50 has a pass band different from the pass band of the filter circuit portion 10. Another filter 50 is, for example, a reception filter that has a downlink frequency band (reception band) as a pass band.

Each of the high frequency filter 1 and another filter 50 is required to have characteristics for allowing a predetermined frequency band to pass and attenuating a band outside the frequency band.

Configuration of High Frequency Filter

The configuration of the high frequency filter 1 will be described with reference to FIGS. 2 to 5.

Figure 2:
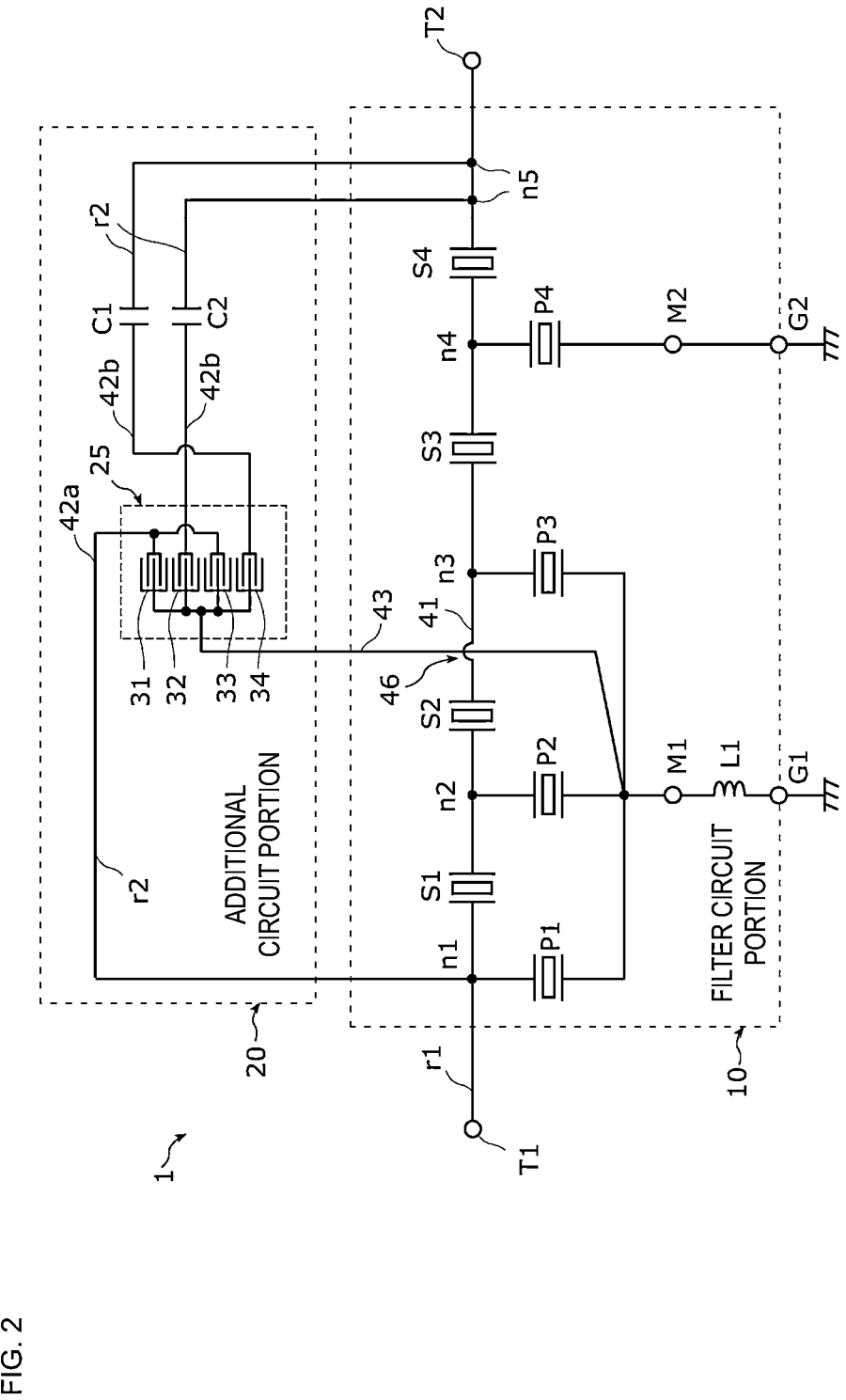
FIG. 2 is a circuit configuration diagram of a high frequency filter according to an example embodiment of the present invention.

FIG. 2 is a circuit configuration diagram of the high frequency filter 1 according to the present example embodiment. Unlike FIG. 1, FIG. 2 illustrates the first signal terminal T1 on the left side of the drawing and the second signal terminal T2 on the right side of the drawing. When the high frequency filter 1 is a transmission filter, the first signal terminal T1 is an input terminal, and the second signal terminal T2 is an output terminal.

As illustrated in FIG. 2, the high frequency filter 1 includes the filter circuit portion 10 and the additional circuit portion 20.

The filter circuit portion 10 preferably includes series arm resonators S1, S2, S3, and S4 and parallel arm resonators P1, P2, P3, and P4 which are acoustic wave resonators. In addition, the filter circuit portion 10 includes an inductor L1 provided on a path between the parallel arm resonators P1 to P3 and a ground. Each of the series arm resonators S1 to S4 and the parallel arm resonators P1 to P3 includes an interdigital transducer (IDT) electrode provided on a piezoelectric substrate which will be described later. The IDT electrode defining the series arm resonators S1 to S4 and the parallel arm resonators P1 to P4 are an example of an electrode of the acoustic wave resonator.

The series arm resonators S1 to S4 are located on the first path r1 connecting the first signal terminal T1 and the second signal terminal T2. The series arm resonators S1 to S4 are connected in series in this order from the first signal terminal T1 toward the second signal terminal T2.

The parallel arm resonators P1 to P4 are connected on paths connecting the ground and nodes n1, n2, n3, and n4, which are located between the first signal terminal T1 and the series arm resonators S1 to S4 on the first path r1.

Specifically, among the parallel arm resonators P1 to P4, the parallel arm resonator P1 closest to the first signal terminal T1 includes one end that is connected to the node n1 between the first signal terminal T1 and the series arm resonator S1, and the other end that is connected to a ground terminal G1 with a connection terminal M1 and the inductor L1 interposed therebetween. The parallel arm resonator P2 includes one end that is connected to the node n2 between the series arm resonators S1 and S2, and the other end that is connected to the ground terminal G1 with the connection terminal M1 and the inductor L1 interposed therebetween. The parallel arm resonator P3 includes one end that is connected to the node n3 between the series arm resonators S2 and S3, and the other end that is connected to the ground terminal G1 with the connection terminal M1 and the inductor L1 interposed therebetween. The parallel arm resonator P4 includes one end that is connected to the node n4 between the series arm resonators S3 and S4, and the other end that is connected to a ground terminal G2 with a connection terminal M2 interposed therebetween.

The other end of each of the parallel arm resonators P1 to P3, which is a portion of the parallel arm resonators P1 to P4, is connected to the connection terminal M1 that is commonized. All of the other ends of the parallel arm resonators P1 to P4 may be connected to the connection terminal M1 that is commonized. The connection terminal M1 is a terminal to connect to the ground and is not necessarily at a ground potential.

As described above, the filter circuit portion 10 includes a ladder filter structure including, for example, four series arm resonators S1 to S4 located on the first path r1 and the four parallel arm resonators P1 to P4 located on a path connecting the first path r1 and the ground. The number of series arm resonators and parallel arm resonators defining the filter circuit portion 10 is not limited to 4, and any desirable number may be used as long as the number of series arm resonators and the number of parallel arm resonators is one or more.

Next, the additional circuit portion 20 of the high frequency filter 1 will be described. The additional circuit portion 20 is a circuit that reduces or prevents unnecessary waves from being output from the high frequency filter 1 by applying an opposite phase to the unnecessary waves outside the pass band generated in the filter circuit portion 10. The additional circuit portion 20 is provided on a piezoelectric substrate which will be described later.

The additional circuit portion 20 is connected to a plurality of different nodes n1 and n5 on the first path r1 so as to be connected parallel to at least a portion of the first path r1. The node n5 is a node located between the series arm resonator S4 and the second signal terminal T2. Although two nodes n5 are illustrated in FIG. 2, the nodes n5 may be grouped into one node.

The additional circuit portion 20 is provided on a path that detours the first path r1 between the node n1 and the node n5, that is, on the second path r2 connecting the node n1 and the node n5. The additional circuit portion 20 includes an acoustically coupled resonator 25 located on the second path r2 and a plurality of capacitance elements C1 and C2. The acoustically coupled resonator 25 is electrically connected to the node n5 with the capacitance element C1 interposed therebetween, and is electrically connected to the node n5 with the capacitance element C2 interposed therebetween.

Figure 3:
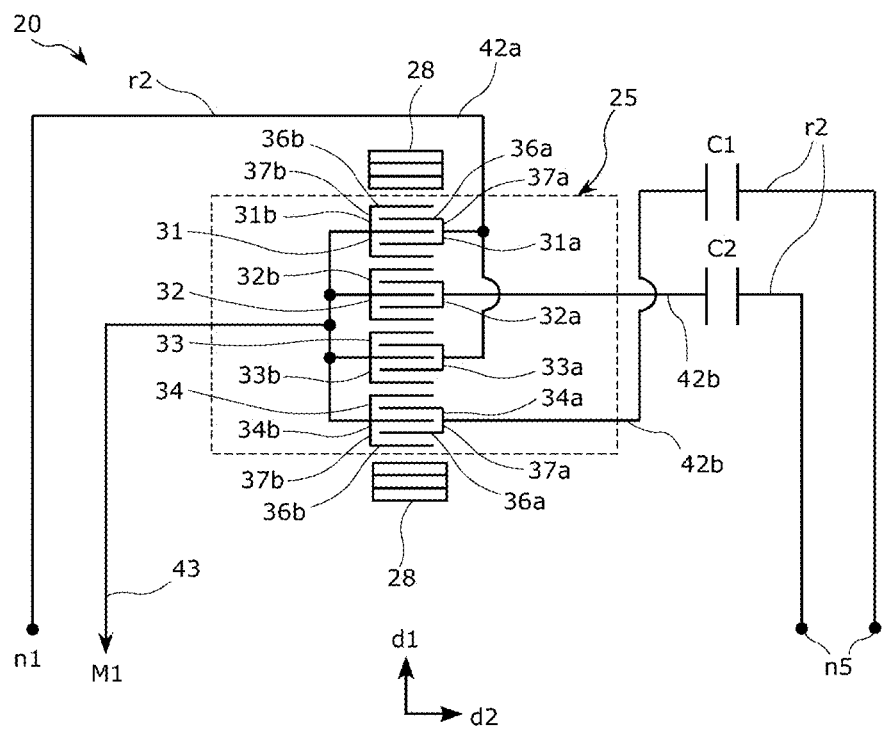
FIG. 3 is a schematic diagram illustrating an acoustically coupled resonator provided in an additional circuit portion of an high frequency filter according to an example embodiment of the present invention.

FIG. 3 is a schematic diagram illustrating the acoustically coupled resonator 25 provided in the additional circuit portion 20 of the high frequency filter 1. In FIG. 3, an electrode and wiring are illustrated by solid lines.

A plurality of reflectors 28 are also illustrated in FIG. 3. The plurality of reflectors 28 are located on two outer side portions of the acoustically coupled resonator 25 so as to sandwich the acoustically coupled resonator 25 therebetween in an acoustic wave propagation direction d1.

The acoustically coupled resonator 25 is a resonator in which a plurality of acoustic wave resonators are located side by side. The acoustically coupled resonator 25 illustrated in FIG. 3 is, for example, a longitudinally coupled acoustic wave resonator, and has a plurality of IDT electrodes 31, 32, 33, and 34. The acoustic wave resonator may be a surface acoustic wave (SAW) resonator or a bulk acoustic wave (BAW) resonator. The acoustic coupling may be a longitudinal coupling type, a horizontal coupling type, or a transversal type.

The plurality of IDT electrodes 31 to 34 are located side by side in this order along the acoustic wave propagation direction d1 (from a plus side to a minus side in the acoustic wave propagation direction d1). Each of the plurality of IDT electrodes includes a pair of a first electrode and a second electrode. Among the plurality of IDT electrodes 31 to 34, the first IDT electrode 31 includes a pair of a first electrode 31a and a second electrode 31b. The second IDT electrode 32 includes a pair of a first electrode 32a and a second electrode 32b. The third IDT electrode 33 includes a pair of a first electrode 33a and a second electrode 33b. The fourth IDT electrode 34 includes a pair of a first electrode 34a and a second electrodes 34b.

For example, the first electrode 31a and the second electrode 31b are comb-shaped electrodes and include a plurality of electrode fingers. The electrode finger of the first electrode 31a and the electrode finger of the second electrode 31b oppose each other in a direction perpendicular or substantially perpendicular to a direction in which each of the electrode fingers 31a and 31b extends, and a capacitance is generated in a facing portion. The same applies to the first electrodes 32a to 34a and the second electrodes 32b to 34b.

When the IDT electrodes 31 to 34 are viewed from a direction perpendicular or substantially perpendicular to a piezoelectric substrate 100 (see FIG. 6), the first electrodes 31a to 34a face the same direction as each other, and are located side by side along the acoustic wave propagation direction d1. In addition, the second electrodes 31b to 34b are located side by side along the acoustic wave propagation direction d1 while facing the same direction as each other.

The first electrodes 31a to 34a are connected to the second path r2. For example, a high frequency signal is input to the first electrodes 31a and 33a from the second path r2. The first electrodes 32a and 34a output the input high frequency signal to the second path r2. The second electrodes 31b to 34b are connected to a connection conductor on a path connecting the parallel arm resonators P1 to P3 and the inductor L1. Specifically, the second electrodes 31b to 34b are connected to one end of the inductor L1 with the connection terminal M1 illustrated in FIG. 2 interposed therebetween, and are further connected to the ground terminal G1 with the inductor L1 interposed therebetween.

For example, in the high frequency filter 1, an attenuation amount outside the pass band, such as a second harmonic wave, can be obtained by using an attenuation pole generated in an LC resonance circuit defined by the parallel arm resonators P1 to P3 and the inductor L1. A resonant frequency of the attenuation pole is determined by the product of an inductance value of the inductor L1 and a combined capacitance value of the parallel arm resonators P1 to P3, but in the present example embodiment, the second electrodes 31b to 34b of the IDT electrodes 31 to 34 are connected to the inductor L1. Therefore, capacitance components of the IDT electrodes 31 to 34 can be added to capacitance components of the parallel arm resonators P1 to P3 of the LC resonance circuit (LC series resonance circuit). Accordingly, the capacitance components in the LC resonance circuit can be increased, and conversely, inductive components can be reduced. As a result, the inductance value of the inductor L1 can be reduced.

The inductor L1 may be provided on the piezoelectric substrate 100, or may be provided on a substrate or a member different from the piezoelectric substrate 100. Hereinafter, an example in which the inductor L1 is provided on the substrate or a member different from the piezoelectric substrate 100 will be described.

Figure 4:
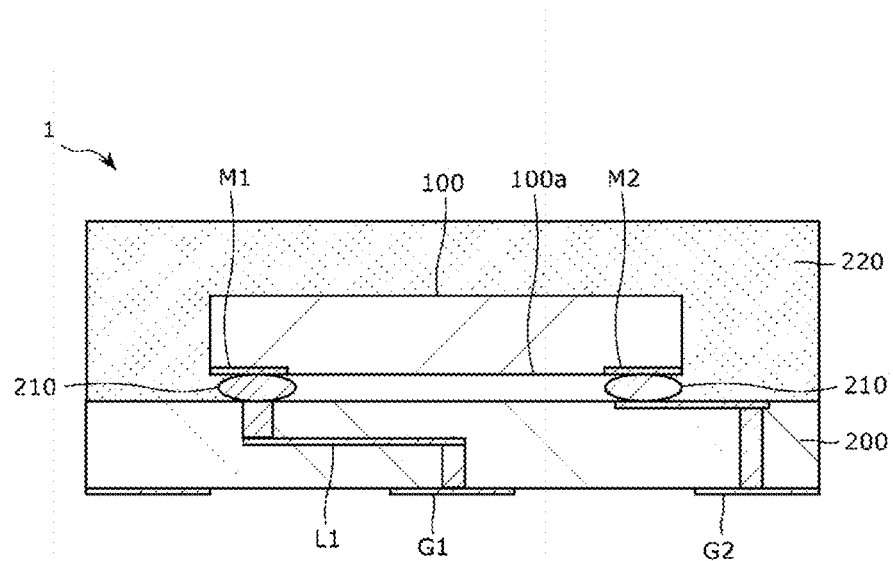
FIG. 4 is a view schematically illustrating a cross section of a high frequency filter according to an example embodiment of the present invention.

FIG. 4 is a view schematically illustrating a cross section of the high frequency filter 1.

As illustrated in FIG. 4, the high frequency filter 1 includes the piezoelectric substrate 100 and a mounting substrate 200.

Other elements of the filter circuit portion 10 excluding the inductor L1 and the additional circuit portion 20 are provided on the piezoelectric substrate 100 (not illustrated). Another filter 50 may be provided on the piezoelectric substrate 100. The connection terminals M1 and M2 are provided on a main surface 100a of the piezoelectric substrate 100. Each of the connection terminals M1 and M2 is preferably bonded to the mounting substrate 200 by a bonding portion 210 such as, for example, solder or conductive paste. The piezoelectric substrate 100 is preferably sealed with a resin material 220.

The inductor L1 and the ground terminals G1 and G2 are provided on the mounting substrate 200. The inductor L1 may be, for example, a wiring pattern provided inside the mounting substrate 200 or may be a via pattern. One end of the inductor L1 is preferably connected to the connection terminal M1 with the wiring conductor in the mounting substrate 200 and the bonding portion 210 interposed therebetween. The connection terminal M1 is connected to the parallel arm resonators P1 to P3 and the second electrodes 31b to 33b described above. The other end of the inductor L1 is connected to the ground terminal G1 with another wiring conductor in the mounting substrate 200 interposed therebetween. The connection terminal M2 is connected to the ground terminal G2 with the bonding portion 210 and another wiring conductor in the mounting substrate 200 interposed therebetween.

For example, a length of the inductor L1 illustrated in FIG. 4 can be shortened by reducing the inductance value of the inductor L1. As a result, a size of the high frequency filter 1 can be reduced.

Figure 5:
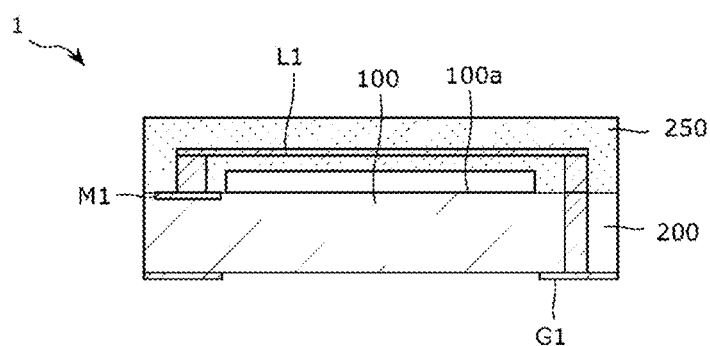
FIG. 5 is a view schematically illustrating another example of a cross section of a high frequency filter according to an example embodiment of the present invention.

FIG. 5 is a view schematically illustrating another example of the cross section of the high frequency filter 1.

As illustrated in FIG. 5, the high frequency filter 1 may include a cover 250 covering the piezoelectric substrate 100.

Other elements of the filter circuit portion 10 excluding the inductor L1 and the additional circuit portion 20 are preferably provided on the piezoelectric substrate 100 (not illustrated). In this example, the inductor L1 is provided on the cover 250, such as a resin, for example. The inductor L1 is provided, for example, inside or on the surface of the cover 250. One end of the inductor L1 may be connected to the parallel arm resonators P1 to P3 and the second electrodes 31b to 33b provided on the piezoelectric substrate 100 with the wiring conductor in the cover 250 interposed therebetween. The other end of the inductor L1 may be connected to the ground terminal G1 with another wiring conductor in the cover 250 and the piezoelectric substrate 100 interposed therebetween.

For example, a length of the inductor L1 illustrated in FIG. 5 can be shortened by reducing the inductance value of the inductor L1. As a result, a size of the high frequency filter 1 can be reduced.

Structure of Acoustically Coupled Resonator of Additional Circuit Portion

A structure of the acoustically coupled resonator 25 of the additional circuit portion 20 will be described with reference to FIG. 6.

Figure 6:
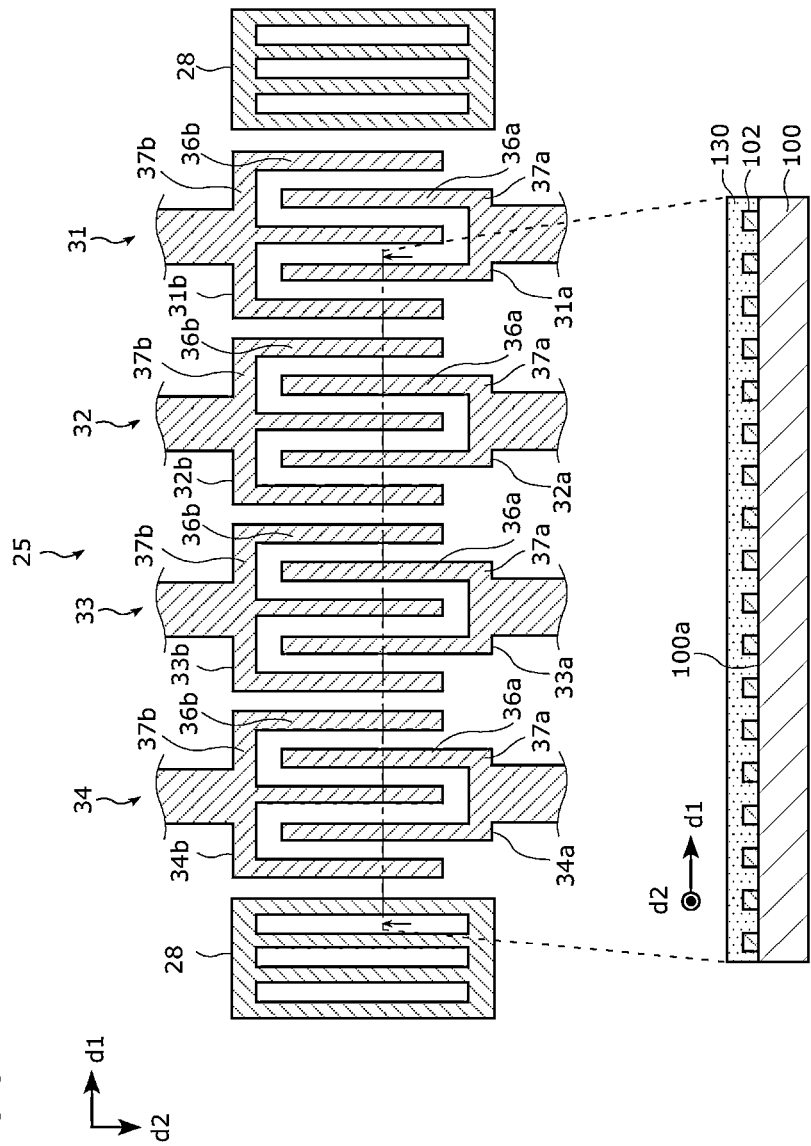
FIG. 6 is a plan view and a cross-sectional view schematically illustrating a structure of the acoustically coupled resonator illustrated in FIG. 3.

FIG. 6 is a plan view and a cross-sectional view schematically illustrating the structure of the acoustically coupled resonator 25. FIG. 6 also illustrates two reflectors 28. The acoustically coupled resonator 25 illustrated in FIG. 6 is for explaining a typical structure of a resonator, and the number, length, and the like of electrode fingers provided in the IDT electrode and the reflector is not limited thereto.

The acoustically coupled resonator 25 includes the piezoelectric substrate 100, an electrode layer 102 defining the plurality of IDT electrodes 31 to 34 provided on the piezoelectric substrate 100, and a dielectric layer 130 provided on the piezoelectric substrate 100 so as to cover each of the IDT electrodes 31 to 34.

The piezoelectric substrate 100 is, for example, a $LiNbO_3$ substrate (lithium niobate substrate) having a cut-angle of about 127.5°. When a Rayleigh wave is used as an acoustic wave propagating in the piezoelectric substrate 100, the cut-angle of the piezoelectric substrate 100 is preferably, for example, about 120°±20° or about 300°±20°. The piezoelectric substrate 100 may be a piezoelectric substrate whose entire substrate includes a piezoelectric layer, or may be a stacked substrate in which the dielectric layer and the piezoelectric layer are stacked on a support substrate.

The dielectric layer 130 is, for example, a dielectric film having silicon dioxide ($SiO_2$) as a main component. The dielectric layer 130 is provided for the purpose of adjusting frequency temperature characteristics of the acoustically coupled resonator 25, protecting the electrode layer 102 from the outside environment, or increasing humidity resistance. In addition, the dielectric layer 130 is used to further add the capacitance components to the LC resonance circuit formed by the parallel arm resonator P1 to P3, the IDT electrodes 31 to 34, and the inductor L1.

The electrode layer 102 includes one metal film or a plurality of metal films. The electrode layer 102 defines the plurality of IDT electrodes 31 to 34.

As illustrated in the plan view of FIG. 6, each of the first electrodes 31a to 4a of the IDT electrodes 31 to 34 preferably includes a plurality of electrode fingers 36a parallel or substantially parallel to each other, and a busbar electrode 37a connecting single ends of the plurality of electrode fingers 36a to each other, respectively. Each of the second electrodes 31b to 34b includes a plurality of electrode fingers 36b parallel or substantially parallel to each other, and a busbar electrode 37b connecting single ends of the plurality of electrode fingers 36b to each other, respectively. Each of the busbar electrodes 37a and 37b extends along the acoustic wave propagation direction d1. The plurality of electrode fingers 36a and 36b extend in an orthogonal direction d2 of the acoustic wave propagation direction d1, are interdigitated with each other in the orthogonal direction d2, and face the acoustic wave propagation direction d1.

Wiring Structure of High Frequency Filter

A wiring structure of the high frequency filter 1 will be described with reference to FIGS. 7 to 9.

Figure 7:
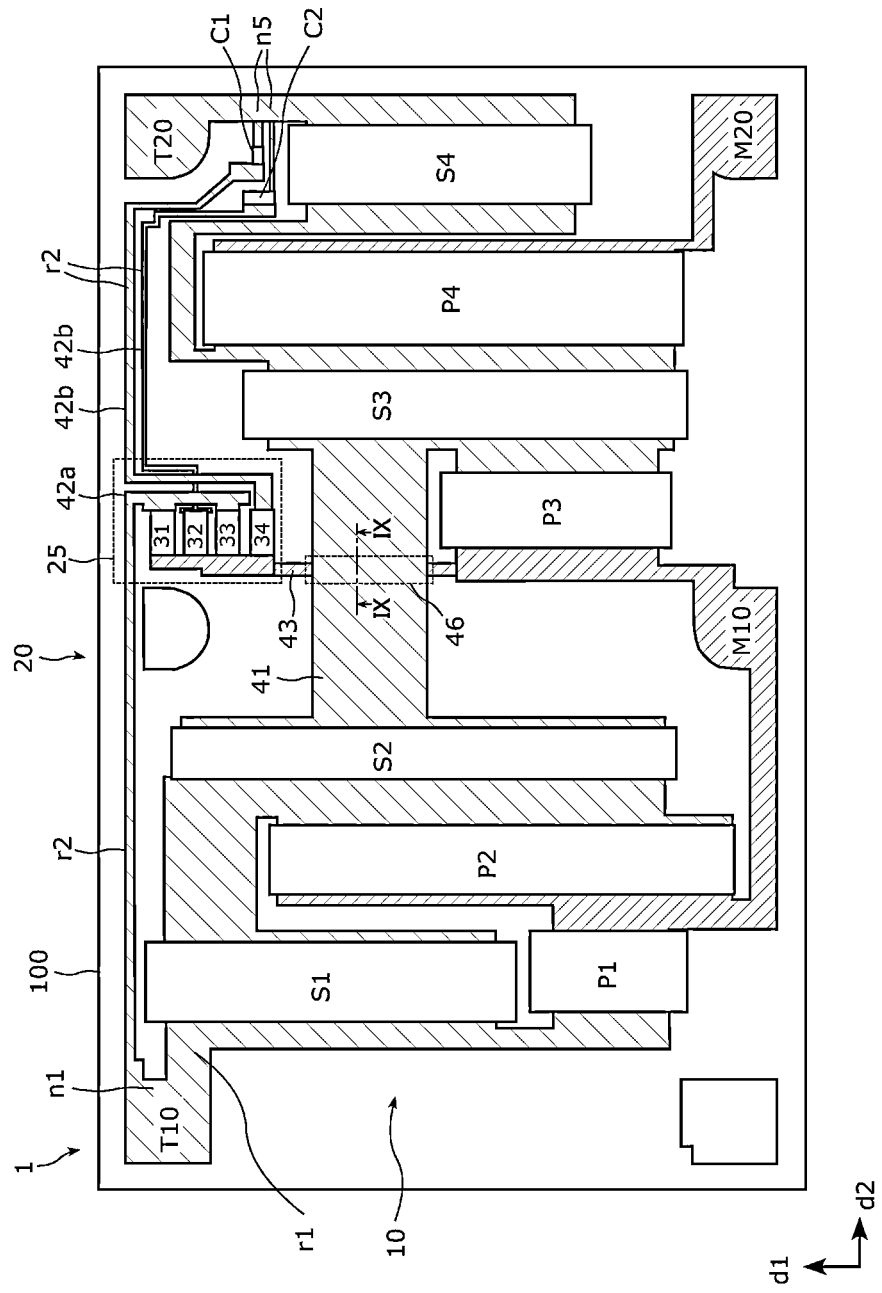
FIG. 7 is a plan view illustrating an additional circuit portion and a portion of a filter circuit portion of a high frequency filter according to an example embodiment of the present invention.

FIG. 7 is a plan view illustrating the additional circuit portion 20 and a portion of the filter circuit portion 10 of the high frequency filter 1. In addition, the dielectric layer 130 is not illustrated in FIG. 7 and subsequent plan views. Further, the reflector 28 may be illustrated in FIG. 7 and subsequent plan views.

As illustrated in FIG. 7, the high frequency filter 1 includes a first signal electrode T10 and a second signal electrode T20 to which a high frequency signal is input and output, and connection electrodes M10 and M20. The connection electrode M10 is an electrode to connect the ground and is not necessarily at the ground potential.

The first signal electrode T10, the second signal electrode T20, and the connection electrodes M10 and M20 are provided on the piezoelectric substrate 100. The first signal electrode T10 is electrically connected to the first signal terminal T1 illustrated in FIG. 2, and the second signal electrode T20 is electrically connected to the second signal terminal T2 illustrated in FIG. 2.

The filter circuit portion 10 including the series arm resonators S1 to S4 and the parallel arm resonators P1 to P4 is located on the first path r1 connecting the first signal electrode T10 and the second signal electrode T20. The additional circuit portion 20 including the acoustically coupled resonator 25 is located on the second path r2 connected parallel to the first path r1.

The connection electrode M10 is an example of a connection conductor to connect the parallel arm resonators P1 to P3 and the inductor L1, and is provided on a path connecting the parallel arm resonators P1 to P3 and the inductor L1. The connection electrode M10 is connected to the ground terminal G1 with the connection terminal M1 and the inductor L1 illustrated in FIG. 2 interposed therebetween. The connection electrode M20 is connected to the ground terminal G2 with the connection terminal M2 illustrated in FIG. 2 interposed therebetween. The connection electrodes M10 and M20 are located while being isolated from each other on the piezoelectric substrate 100.

Figure 8:
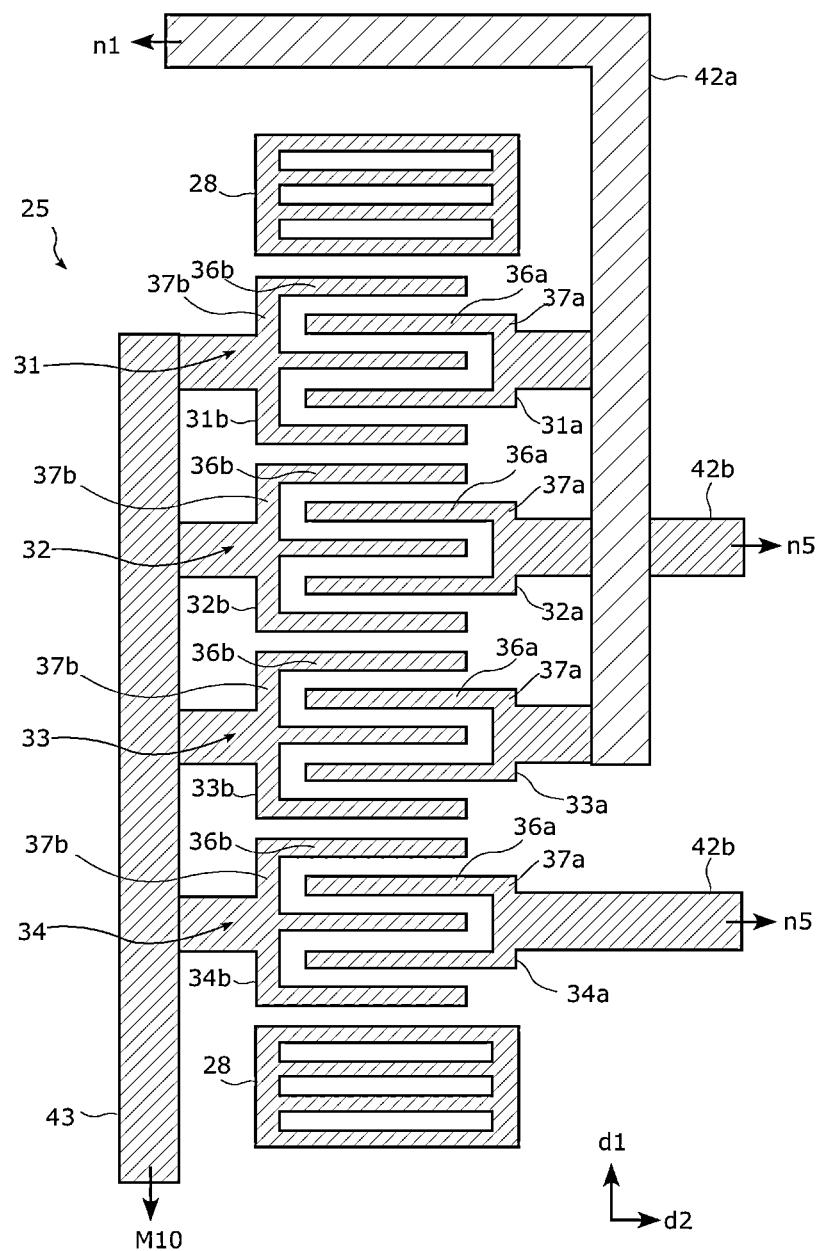
FIG. 8 is an enlarged view of a portion of the additional circuit portion of the high frequency filter illustrated in FIG. 7.

FIG. 8 is an enlarged view of a portion of the additional circuit portion 20 of the high frequency filter 1 illustrated in FIG. 7.

As illustrated in FIG. 8, the acoustically coupled resonator 25 of the additional circuit portion 20 includes four IDT electrodes 31 to 34. The first electrodes 31a to 34a of the IDT electrodes 31 to 34 are electrically connected to a plurality of different nodes n1 and n5 on the first path r1. For example, the first electrodes 31a and 33a are connected to the node n1 with one sub wiring 42a provided on the second path r2 interposed therebetween, and the first electrodes 32a and 34a are connected to the node n5 with the other sub wiring 42b provided on the second path r2 interposed therebetween. Each of the second electrodes 31b to 34b is electrically connected to the connection electrode M10 with the lead-out wiring 43 interposed therebetween.

In the above description, the connection electrode M10 is described as an example of a connection conductor, but the connection conductor is not limited to the connection electrode M10, and may be a conductor provided on the path connecting the parallel arm resonators P1 to P3 and the inductor L1. For example, as illustrated in FIG. 7, the connection conductor to which the second electrodes 31b to 34b are connected may be a busbar electrode on the other end side (on the connection electrode M10 side) of the parallel arm resonator P3. In addition, the connection conductor may be a busbar electrode on the other end side of the parallel arm resonator P1 or P2, or may be a node to which the parallel arm resonators P1 to P3 are connected.

Moreover, all of the second electrodes 31b to 34b do not need to be electrically connected to one end of the inductor L1, and a portion of the second electrodes 31b to 34b may be electrically connected to one end of the inductor L1. A case where the second electrodes 31b to 34b are connected between the other end of the inductor L1 and the ground is not included in the present example embodiment.

In the high frequency filter 1 of the present example embodiment, as illustrated in FIG. 7, the lead-out wiring 43 connecting the second electrodes 31b to 34b and the connection electrode M10 three-dimensionally intersects main wiring 41 provided on the first path r1. Specifically, the lead-out wiring 43 three-dimensionally intersects the main wiring 41 between the series arm resonators S2 and S3.

Figure 9:
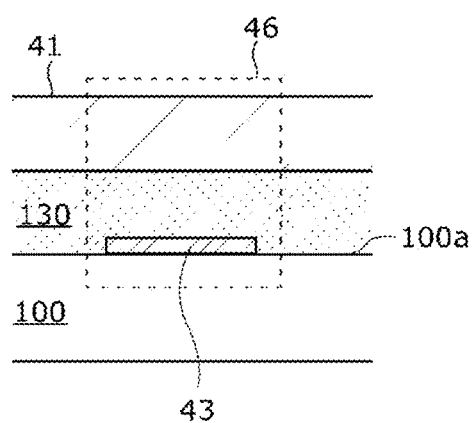
FIG. 9 is a cross-sectional view of the high frequency filter according to the example embodiment of the present invention, when viewed from IX-IX line illustrated in FIG. 7.

FIG. 9 is a cross-sectional view of the high frequency filter 1, when viewed from IX-IX line illustrated in FIG. 7. In FIG. 9, a thickness of the piezoelectric substrate 100 is illustrated to be thinner than an actual thickness. The same applies to the following cross-sectional views.

As illustrated in FIG. 9, the lead-out wiring 43 connecting the second electrodes 31b to 34b and the connection electrode M10 includes a first facing region 46 that opposes the main wiring 41 provided on the first path r1 with the dielectric layer 130 interposed therebetween.

For example, the lead-out wiring 43 includes a lower layer metal film provided on the piezoelectric substrate 100, and the dielectric layer 130 is provided on the lead-out wiring 43. The main wiring 41 is provided on the dielectric layer 130. The main wiring 41 includes an upper layer metal film on the first path r1. That is, the dielectric layer 130 is provided between the lead-out wiring 43 and the main wiring 41.

The main wiring 41 is, for example, a hot-side wiring through which a high frequency signal is transmitted, and the lead-out wiring 43 is, for example, a ground-side wiring connected to the ground with the inductor L1 interposed therebetween. Therefore, a predetermined capacitance component is provided in the first facing region 46 where the lead-out wiring 43 and the main wiring 41 oppose each other with the dielectric layer 130 interposed therebetween.

In the present example embodiment, a predetermined capacitance component provided in the first facing region 46 can be further added to the capacitance components of the parallel arm resonators P1 to P3 and the IDT electrodes 31 to 34 of the LC resonance circuit. Accordingly, the capacitance components in the LC resonance circuit can be increased, and conversely, inductive components can be reduced. As a result, the inductance value of the inductor L1 can be further reduced.

The pass characteristics of the high frequency filter 1 having the above configuration will be described while being compared with a comparative example.

Figure 10:
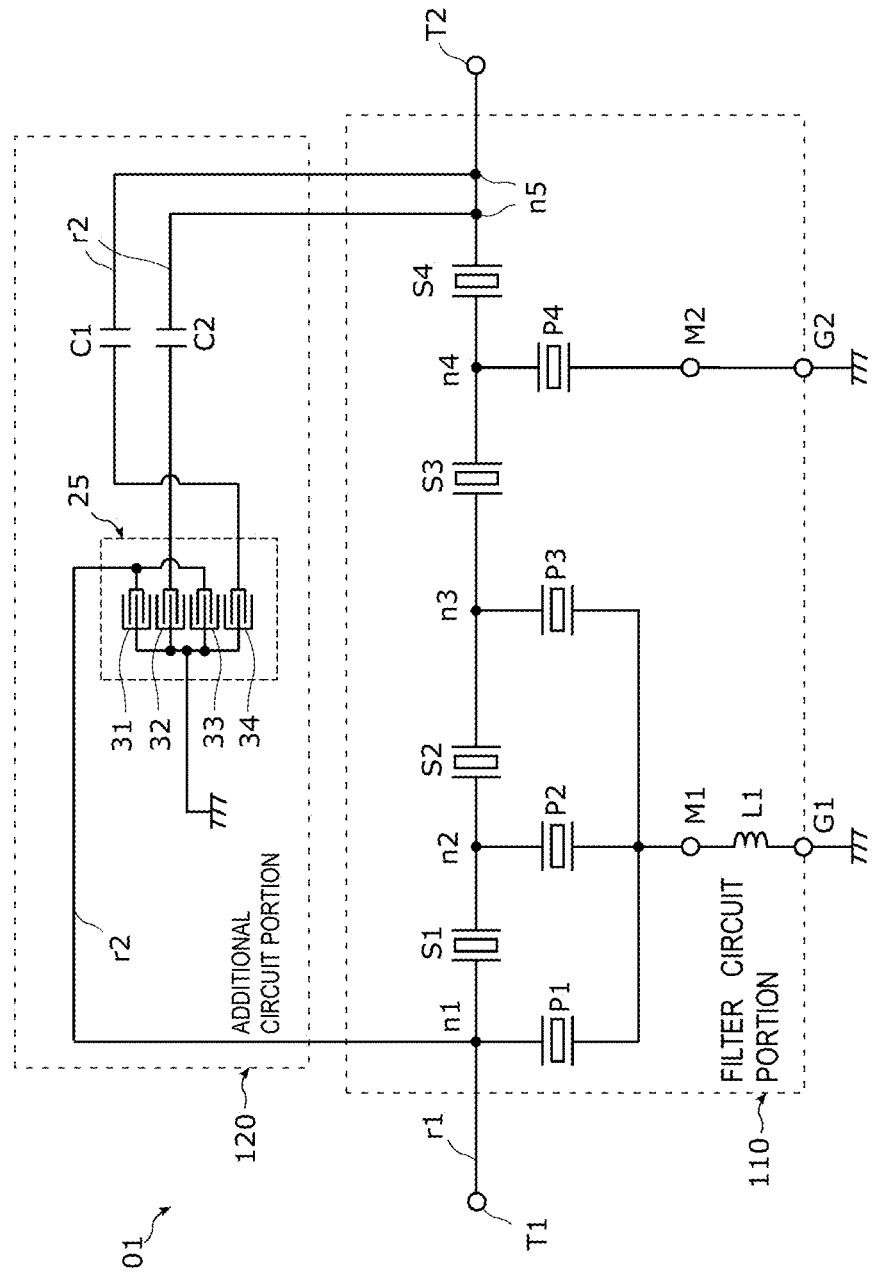
FIG. 10 is a circuit configuration diagram of a high frequency filter according to a comparative example.

FIG. 10 is a diagram illustrating a high frequency filter 101 of a comparative example. The high frequency filter 101 according to the comparative example also includes a filter circuit portion 110 and an additional circuit portion 120. In the high frequency filter 101 according to the comparative example, the second electrodes 31b to 34b of the IDT electrodes 31 to 34 are not connected to one end of the inductor L1 and are set to a ground potential. For example, in the comparative example, the second electrodes 31b to 34b are connected to a ground terminal different from the connection terminal M1.

Figure 11A:
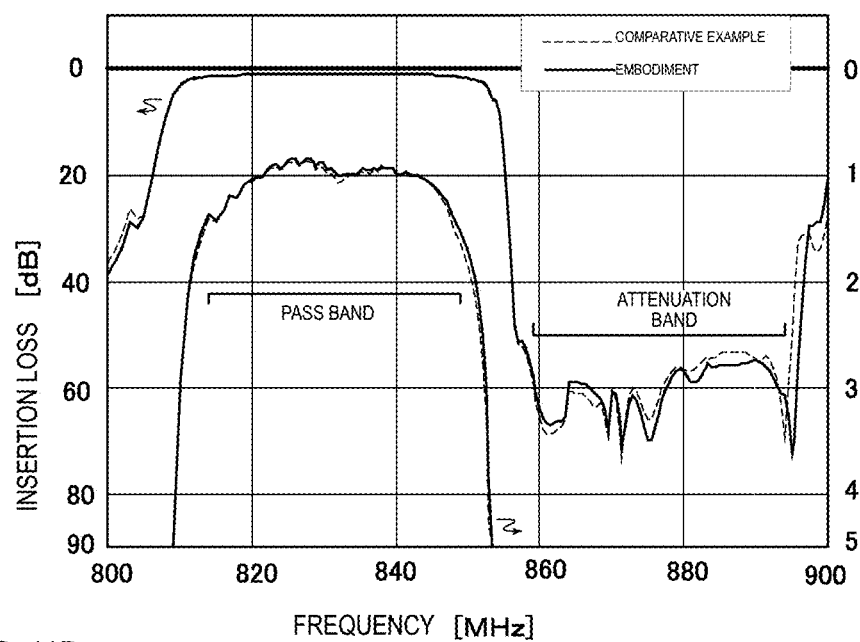
FIGS. 11A and 11B are views illustrating pass characteristics of a high frequency filter according to an example embodiment of the present invention and the high frequency filter according to the comparative example.
Figure 11B:
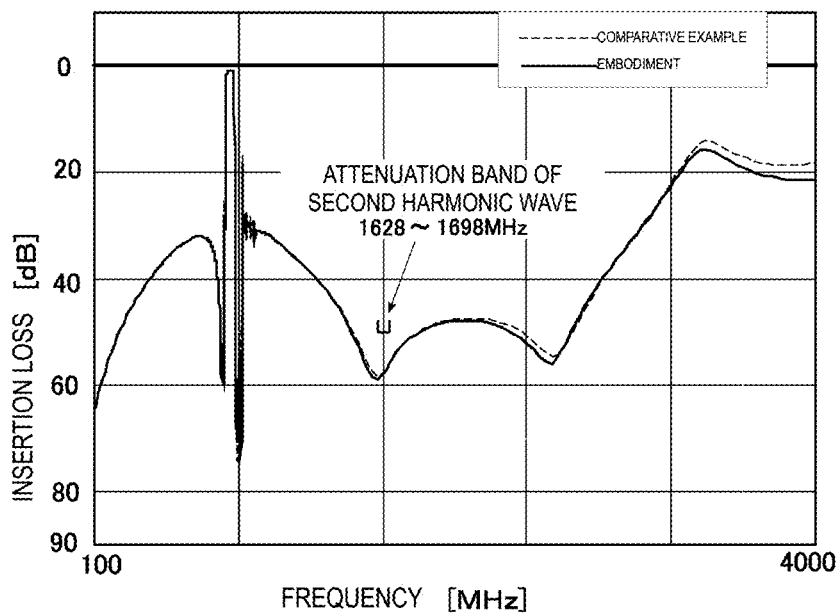

FIGS. 11A and 11B are views illustrating pass characteristics of the high frequency filter 1 according to the present example embodiment and the high frequency filter 101 according to the comparative example. In FIGS. 11A and 11B, an example in which the high frequency filters 1 and 101 are transmission filters and another filter 50 is a reception filter is illustrated. FIG. 11A illustrates a pass band (for example, about 814 MHz to about 849 MHz) of the transmission filter and a pass band (for example, about 859 MHz to about 894 MHz) of the reception filter. FIG. 11B illustrates transmission characteristics of an attenuation band including the second harmonic wave of the high frequency filters 1 and 101.

As described above, in the high frequency filters 1 and 101, the attenuation amount in the second harmonic wave is obtained by matching a generation frequency of the attenuation pole generated in the LC resonance circuit to a band of the second harmonic wave.

FIG. 11B illustrates a state in which the generation frequency of the attenuation pole matches the band of the second harmonic wave by adjusting the inductance value of the inductor L1 in each of the present example embodiment and the comparative example. When the inductance value of the inductor L1 at this time is compared, the inductance value is about 0.56 nH in the present example embodiment and about 0.71 nH in the comparative example, and the inductance value of the present example embodiment is smaller than that of the comparative example. As in the present example embodiment, the second electrodes 31b to 34b of the IDT electrodes 31 to 34 are connected to the inductor L1, so that the capacitance components of the IDT electrodes 31 to 34 are added to the LC resonance circuit, and the inductance value of the inductor L1 can be reduced.

Furthermore, as illustrated in FIG. 11A, an insertion loss in the attenuation band (pass band of another filter 50) outside the pass band of the high frequency filters 1 and 101 is about 54.7 dB in the present example embodiment, and about 53.0 dB in the comparative example. That is, the example embodiment has a larger attenuation amount than the comparative example.

For example, in an LC resonance circuit, the resonant frequency is represented by the formula 1/(2 rVILC), but in order to match the resonant frequency with the attenuation band, the attenuation band needs to match by fixing an integrated value of an L value and a C value. In addition, it is preferable to adjust the attenuation amount by changing the C value to increase the attenuation amount in the attenuation band, for example, the attenuation amount increases by increasing the C value and reducing the L value.

In the present example embodiment, the second electrodes 31b to 34b of the IDT electrodes 31 to 34 are connected to the inductor L1, so that the capacitance components of the IDT electrodes 31 to 34 are added to the LC resonance circuit. As a result, the inductance value of the inductor L1 can be reduced. Therefore, in the LC resonance circuit, the C value can be increased and the L value can be reduced, and the attenuation amount can be secured in the attenuation band of the high frequency filter 1.

Further, as illustrated in FIG. 11A, the insertion loss in the pass band of the high frequency filters 1 and 101 is about 1.53 dB in the present example embodiment and about 1.64 dB in the comparative example. That is, the present example embodiment has a smaller insertion loss than the comparative example.

In the present example embodiment, the second electrodes 31b to 34b of the IDT electrodes 31 to 34 are connected to the inductor L1, so that the capacitance components of the IDT electrodes 31 to 34 are added to the LC resonance circuit. As a result, the inductance value of the inductor L1 can be reduced. By reducing the inductance value, a resistance component of the inductor L1 can also be reduced, and a loss due to the resistance component can be suppressed. Accordingly, it is possible to suppress a decrease in the insertion loss in the pass band of the high frequency filter 1.

First Modified Example of Example Embodiment

Configuration of High Frequency Filter

A high frequency filter 1A according to a first modified example of the present example embodiment will be described with reference to FIG. 12. In the first modified example, an example in which IDT electrodes 31 to 34 included in acoustically coupled resonator 25A are differently located will be described.

The high frequency filter 1A of the first modified example includes a filter circuit portion 10 and an additional circuit portion 20. The filter circuit portion 10 includes series arm resonators S1, S2, S3, and S4 and parallel arm resonators P1, P2, P3, and P4 which are acoustic wave resonators. In addition, the filter circuit portion 10 includes an inductor L1 provided on a path between the parallel arm resonators P1 to P3 and a ground. The additional circuit portion 20 is connected to a plurality of different nodes n1 and n5 on the first path r1 so as to be connected parallel to at least a portion of the first path r1.

Figure 12:
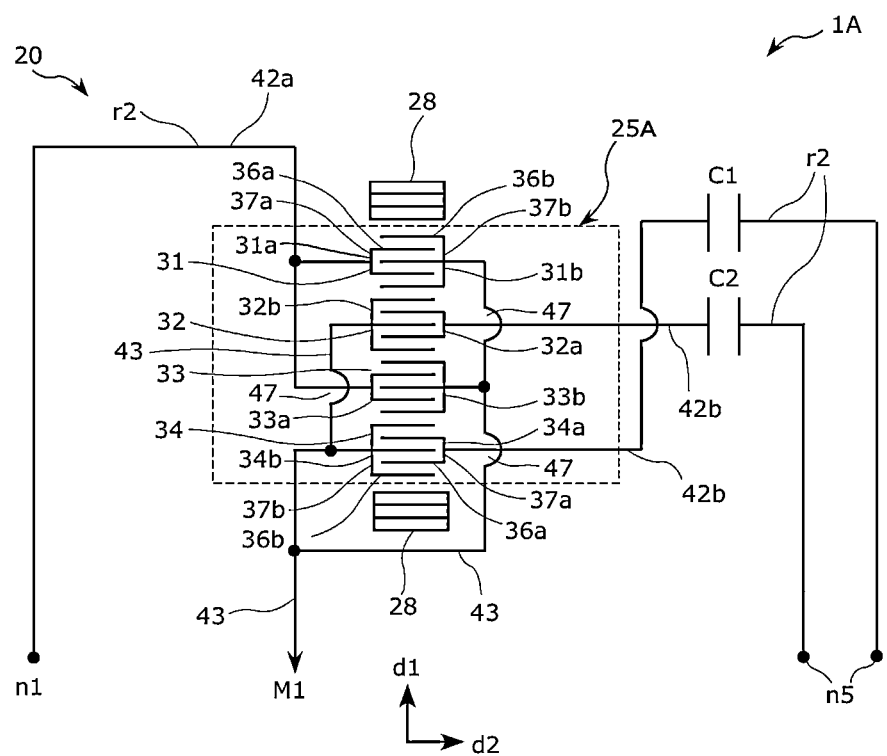
FIG. 12 is a schematic diagram illustrating an acoustically coupled resonator provided in an additional circuit portion of a high frequency filter according to a first modified example of an example embodiment of the present invention.

FIG. 12 is a schematic diagram illustrating the acoustically coupled resonator 25A provided in the additional circuit portion 20 of the high frequency filter 1A. In FIG. 12, an electrode and wiring are illustrated by solid lines.

The acoustically coupled resonator 25A is a resonator in which a plurality of acoustic wave resonators are located side by side. The acoustically coupled resonator 25A illustrated in FIG. 12 is a longitudinally coupled acoustic wave resonator, and has a plurality of IDT electrodes 31, 32, 33, and 34.

The plurality of IDT electrodes 31 to 34 are located side by side in this order along the acoustic wave propagation direction d1. Each of the plurality of IDT electrodes has a pair of a first electrode and a second electrode.

When the IDT electrodes 31 to 34 are viewed from a direction perpendicular or substantially perpendicular to a piezoelectric substrate 100, first electrodes 31a and 33a face the same direction as each other, and first electrodes 32a and 34a face a direction opposite to the first electrodes 31a and 33a.

The first electrodes 31a to 34a are connected to the second path r2. For example, a high frequency signal is input to the first electrodes 31a and 33a from the second path r2. The first electrodes 32a and 34a output the input high frequency signal to the second path r2. Second electrodes 31b to 34b are connected to one end of the inductor L1 with the connection terminal M1 interposed therebetween, and are further connected to a ground terminal G1 with the inductor L1 interposed therebetween.

In the first modified example, the second electrodes 31b to 34b of the IDT electrodes 31 to 34 are connected to the inductor L1. Therefore, the capacitance components of the IDT electrodes 31 to 34 can be added to the capacitance components of the parallel arm resonators P1 to P3 of the LC resonance circuit. Accordingly, the capacitance components in the LC resonance circuit can be increased, and conversely, inductive components can be reduced. As a result, the inductance value of the inductor L1 can be reduced.

Wiring Structure of High Frequency Filter

A wiring structure of the high frequency filter 1A will be described with reference to FIGS. 13 to 15B.

Figure 13:
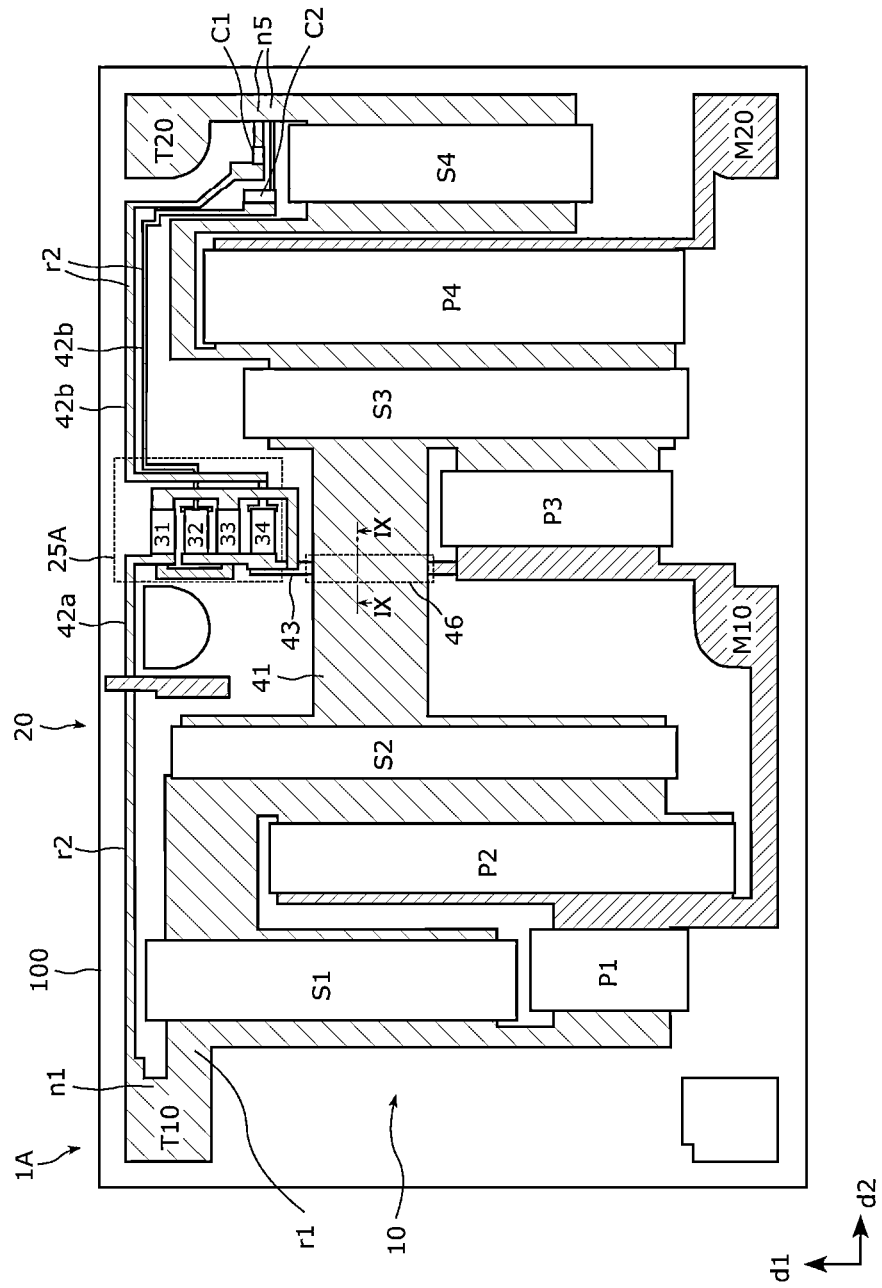
FIG. 13 is a plan view illustrating an additional circuit portion and a portion of a filter circuit portion of the high frequency filter according to the first modified example.

FIG. 13 is a plan view illustrating the additional circuit portion 20 and a portion of the filter circuit portion 10 of the high frequency filter 1A.

As illustrated in FIG. 13, the high frequency filter 1A includes a first signal electrode T10 and a second signal electrode T20 to which a high frequency signal is input and output, and connection electrodes M10 and M20.

Figure 14:
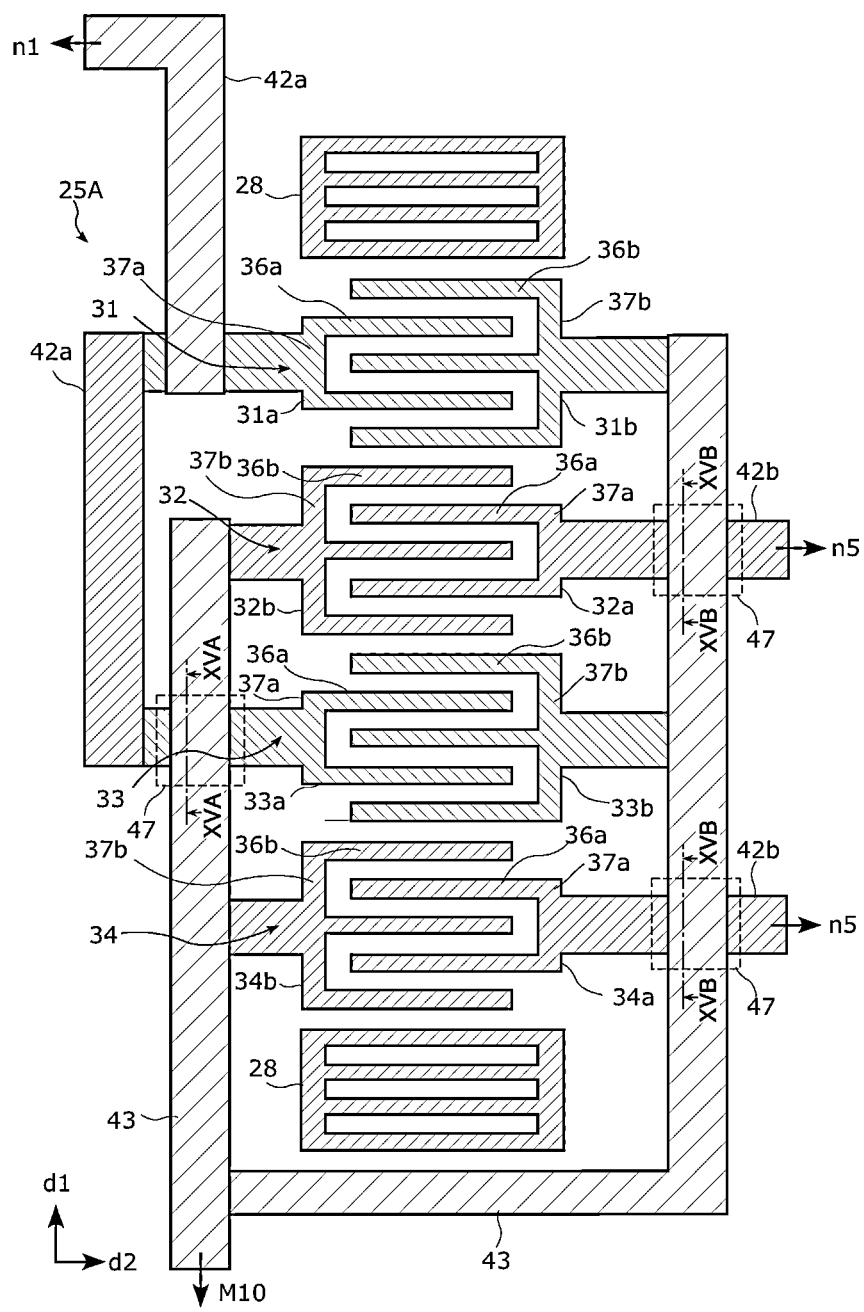
FIG. 14 is an enlarged view of a portion of the additional circuit portion of the high frequency filter illustrated in FIG. 13.

FIG. 14 is an enlarged view of a portion of the additional circuit portion 20 of the high frequency filter 1A illustrated in FIG. 13.

As illustrated in FIG. 14, the acoustically coupled resonator 25A of the additional circuit portion 20 includes four IDT electrodes 31 to 34. The first electrodes 31a to 34a of the IDT electrodes 31 to 34 are electrically connected to a plurality of different nodes n1 and n5 on the first path r1.

For example, the first electrodes 31a and 33a are connected to the node n1 with one sub wiring 42a provided on the second path r2 interposed therebetween, and each of the first electrodes 32a and 34a is connected to the node n5 with the other sub wiring 42b provided on the second path r2 interposed therebetween. Each of the second electrodes 31b to 34b is electrically connected to the connection electrode M10 with the lead-out wiring 43 interposed therebetween.

In the high frequency filter 1A of the first modified example, as in the present example embodiment, the lead-out wiring 43 connecting the second electrodes 31b to 34b and the connection electrode M10 three-dimensionally intersects main wiring 41 provided on the first path r1.

Moreover, in the first modified example, one sub wiring 42a three-dimensionally intersects the lead-out wiring 43, and the other sub wiring 42b three-dimensionally intersects the lead-out wiring 43.

Figure 15A:
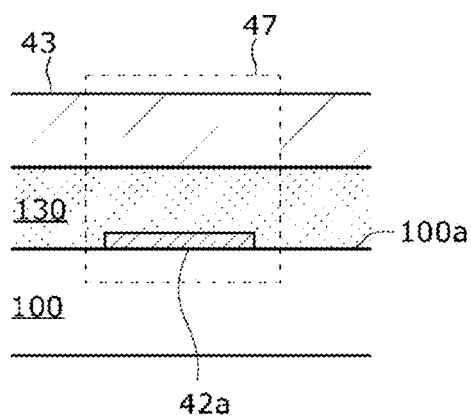
FIG. 15A is a cross-sectional view of the high frequency filter according to the first modified example of the example embodiment of the present invention, when viewed from XVA-XVA line illustrated in FIG. 14.
Figure 15B:
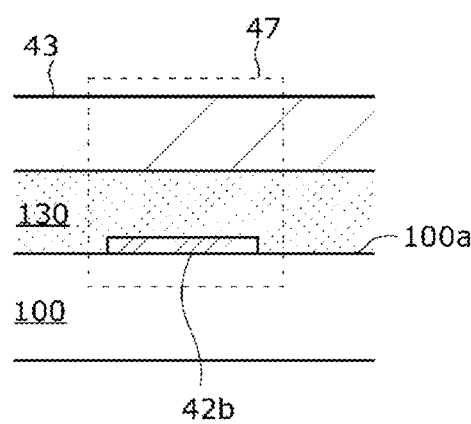
FIG. 15B is a cross-sectional view of the high frequency filter according to the first modified example of the example embodiment of the present invention, when viewed from XVB-XVB line illustrated in FIG. 14.

FIG. 15A is a cross-sectional view of the high frequency filter 1A according to the first modified example, when viewed from XVA-XVA line illustrated in FIG. 14. FIG. 15B is a cross-sectional view of the high frequency filter 1A according to the first modified example, when viewed from XVB-XVB line illustrated in FIG. 14.

As illustrated in FIG. 15A, in the acoustically coupled resonator 25A according to the first modified example, one sub wiring 42a connected to the first electrode 33a of the IDT electrode 33 three-dimensionally intersects the lead-out wiring 43 connected to the second electrode 32b of the IDT electrode 32. In addition, as illustrated in FIG. 15B, the other sub wiring 42b connected to the first electrode 32a of the IDT electrode 32 three-dimensionally intersects the lead-out wiring 43 connected to the second electrode 31b of the IDT electrode 31. In addition, as illustrated in FIG. 15B, the other sub wiring 42b connected to the first electrode 34a of the IDT electrode 34 three-dimensionally intersects the lead-out wiring 43 connected to the second electrode 33b of the IDT electrode 33.

As described above, the lead-out wiring 43 connecting the second electrodes 32b and 34b and the connection electrode M10 includes a plurality of second facing regions 47 that oppose one sub wiring 42a provided on the second path r2 with the dielectric layer 130 interposed therebetween. In addition, the lead-out wiring 43 connecting the second electrodes 31b and 33b and the connection electrode M10 includes a plurality of second facing regions 47 that oppose the other sub wiring 42b provided on the second path r2 with the dielectric layer 130 interposed therebetween.

For example, one sub wiring 42a includes a lower layer metal film provided on the piezoelectric substrate 100. The dielectric layer 130 is provided on the sub wiring 42a. The lead-out wiring 43 is provided on the dielectric layer 130. The lead-out wiring 43 in the acoustically coupled resonator 25A includes an upper layer metal film. In other words, the dielectric layer 130 is provided between the lead-out wiring 43 and the sub wirings 42a and 42b.

For example, the lead-out wiring 43 includes a lower layer metal film provided on the piezoelectric substrate 100, and the dielectric layer 130 is provided on the lower layer metal film. The sub wirings 42a and 42b include an upper layer metal film provided on the dielectric layer 130. In other words, the dielectric layer 130 is provided between the lead-out wiring 43 and the sub wirings 42a and 42b.

For example, the sub wirings 42a and 42b are hot-side wirings through which a high frequency signal is transmitted, and the lead-out wiring 43 is ground-side wiring connected to the ground with the inductor L1 interposed therebetween. Therefore, predetermined capacitance components are provided in the plurality of second facing regions 47 where the lead-out wiring 43 and the sub wirings 42a and 42b oppose each other with the dielectric layer 130 interposed therebetween.

In the first modified example, the predetermined capacitance components provided in the second facing regions 47 can be further added to the capacitance components of the parallel arm resonators P1 to P3, the capacitance components of the IDT electrodes 31 to 34 of the LC resonance circuit, and the capacitance components of the first facing region 46. Accordingly, the capacitance components in the LC resonance circuit can be increased, and conversely, inductive components can be reduced. As a result, the inductance value of the inductor L1 can be further reduced.

The pass characteristics of the high frequency filter 1A having the above configuration will be described while being compared with the example embodiment.

Figure 16A:
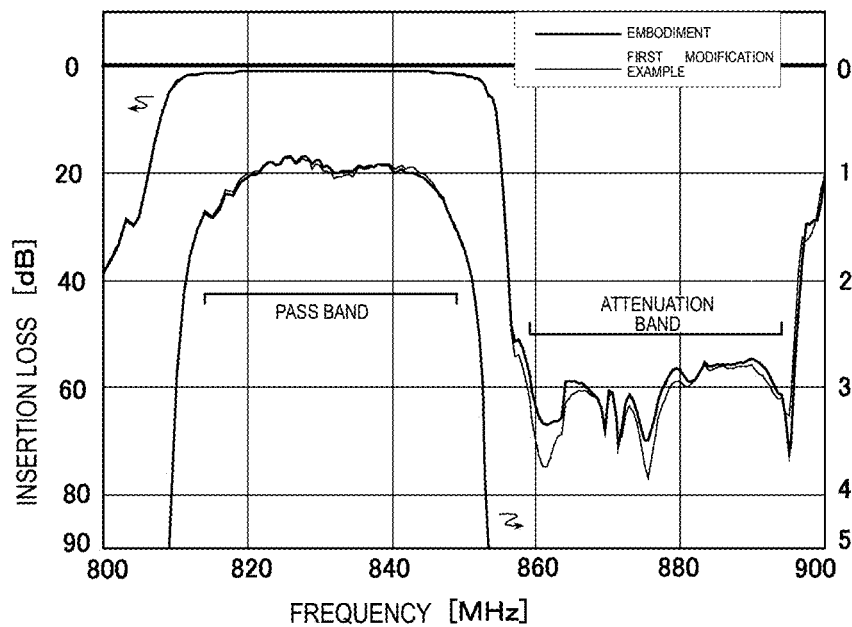
FIGS. 16A and 16B are views illustrating pass characteristics of a high frequency filter according to an example embodiment of the present invention and the high frequency filter according to the first modified example.
Figure 16B:
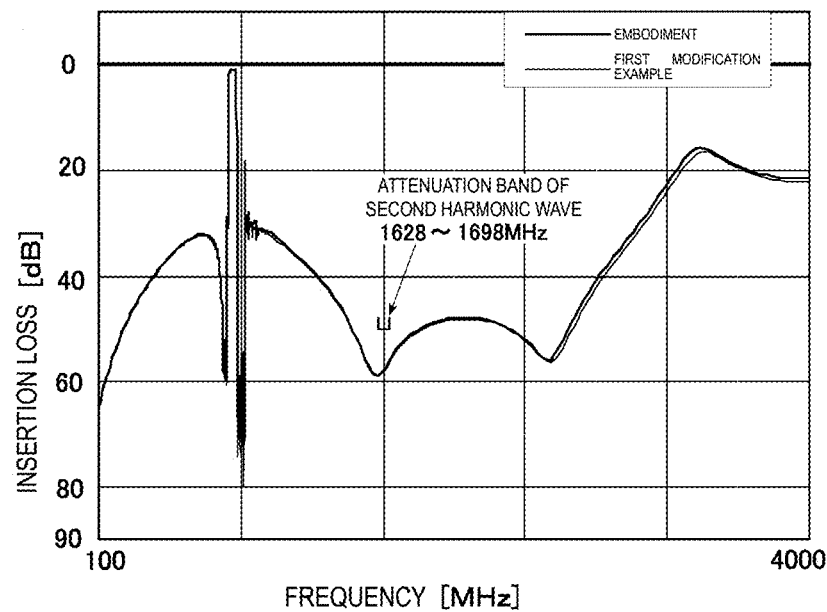

FIGS. 16A and 16B are views illustrating pass characteristics of the high frequency filter 1 according to the present example embodiment and the high frequency filter 1A according to the first modified example. In FIGS. 16A and 16B, an example in which the high frequency filters 1 and 1A are transmission filters and another filter 50 is a reception filter is illustrated. FIG. 16A illustrates a pass band (for example, about 814 MHz to about 849 MHz) of the transmission filter and a pass band (for example, about 859 MHz to about 894 MHz) of the reception filter. FIG. 16B illustrates transmission characteristics of an attenuation band including the second harmonic wave of the high frequency filters 1 and 1A.

In the high frequency filters 1 and 1A, the attenuation amount in the second harmonic wave is obtained by matching a generation frequency of the attenuation pole generated in the LC resonance circuit to a band of the second harmonic wave.

FIG. 16B illustrates a state in which the generation frequency of the attenuation pole matches the band of the second harmonic wave by adjusting the inductance value of the inductor L1 in each of the present example embodiment and the first modified example. When the inductance value of the inductor L1 at this time is compared, for example, the inductance value is about 0.56 nH in the example embodiment and about 0.5 nH in the first modified example, and the inductance value of the first modified example is smaller than that of the example embodiment. As in the first modified example, by adding the capacitance components formed in the second facing regions 47 to the LC resonance circuit, the inductance value of the inductor L1 can be further reduced.

Furthermore, as illustrated in FIG. 16A, an insertion loss in the attenuation band (pass band of another filter 50) outside the pass band of the high frequency filters 1 and 1A is, for example, about 54.7 dB in the example embodiment, and about 55.8 dB in the first modified example. That is, the first modified example has a larger attenuation amount than the present example embodiment.

In the first modified example, by adding the capacitance components in the second facing regions 47 to the LC resonance circuit, the inductance value of the inductor L1 can be further reduced. Therefore, in the LC resonance circuit, the C value can be increased and the L value can be reduced, and the attenuation amount can be secured in the attenuation band of the high frequency filter 1A.

Further, as illustrated in FIG. 16A, the insertion loss in the pass band of the high frequency filters 1 and 1A is, for example, about 1.53 dB in the present example embodiment and about 1.53 dB in the first modified example. That is, the present example embodiment and the first modified example have the same or substantially the same insertion loss.

In the first modified example, by adding the predetermined capacitance components in the second facing regions 47 to the LC resonance circuit, the inductance value of the inductor L1 can be reduced. By reducing the inductance value, a resistance component of the inductor L1 can also be reduced, and a loss due to the resistance component can be suppressed. Accordingly, it is possible to suppress a decrease in the insertion loss in the pass band of the high frequency filter 1A.

Second Modified Example of Example Embodiment

A high frequency filter 1B according to a second modified example of the present invention will be described with reference to FIGS. 17 to 19. In the second modified example, an example in which second electrodes 31b to 34b included in an acoustically coupled resonator 25A is not connected to a connection electrode M10 in a piezoelectric substrate 100, and is connected to one end of an inductor L1 on a mounting substrate 200 will be described.

Figure 17:
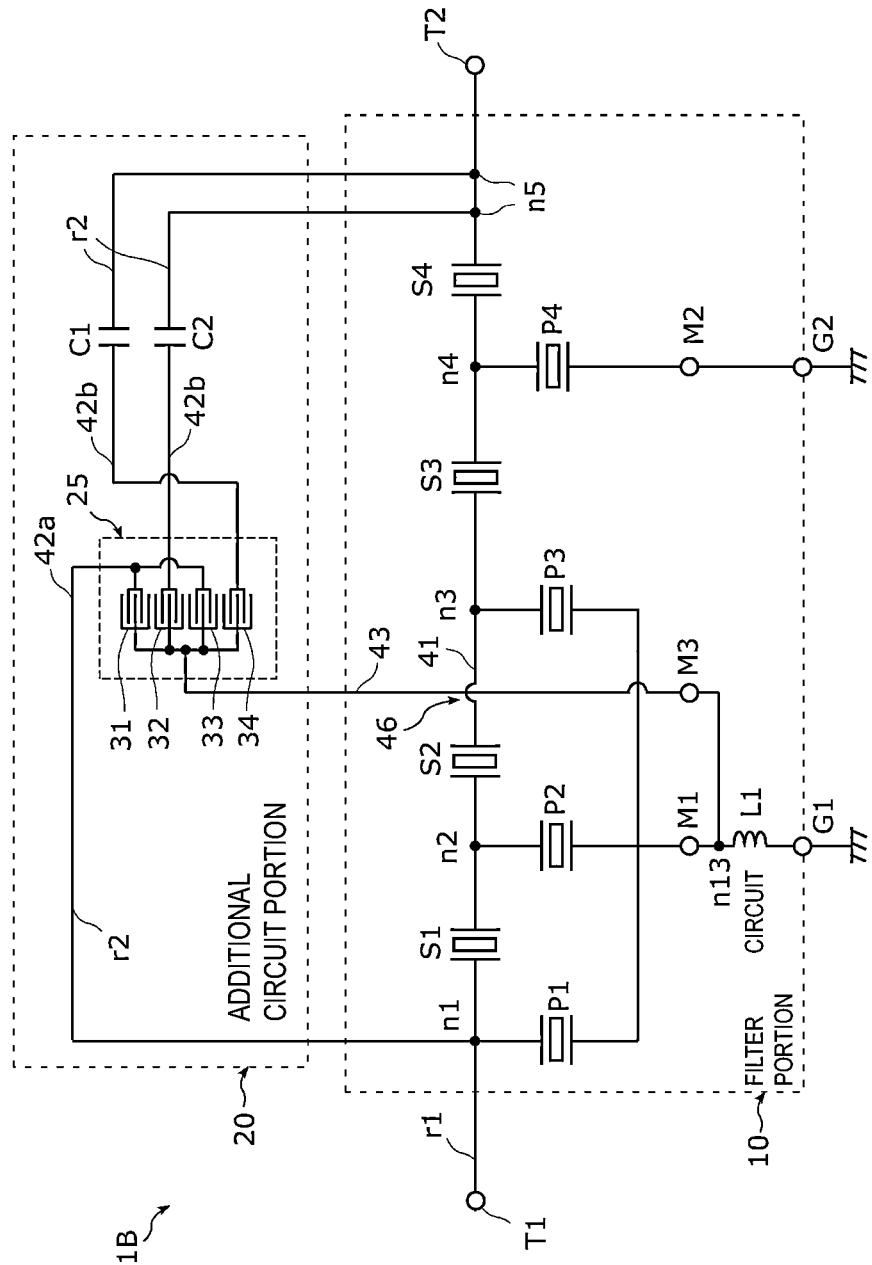
FIG. 17 is a circuit configuration diagram of the high frequency filter according to a second modified example of the example embodiment of the present invention.

FIG. 17 is a circuit configuration diagram of the high frequency filter 1B according to the second modified example. The circuit configuration diagram of second modified example is the same or substantially the same as the circuit configuration diagram of the example embodiment illustrated in FIG. 2.

The high frequency filter 1B according to second modified example includes a filter circuit portion 10 and an additional circuit portion 20. The filter circuit portion 10 includes series arm resonators S1, S2, S3, and S4 and parallel arm resonators P1, P2, P3, and P4 which are acoustic wave resonators. In addition, the filter circuit portion 10 also includes an inductor L1 provided on a path between the parallel arm resonators P1 to P3 and a ground. The additional circuit portion 20 is connected to a plurality of different nodes n1 and n5 on the first path r1 so as to be connected in parallel to at least a portion of the first path r1.

Figure 18:
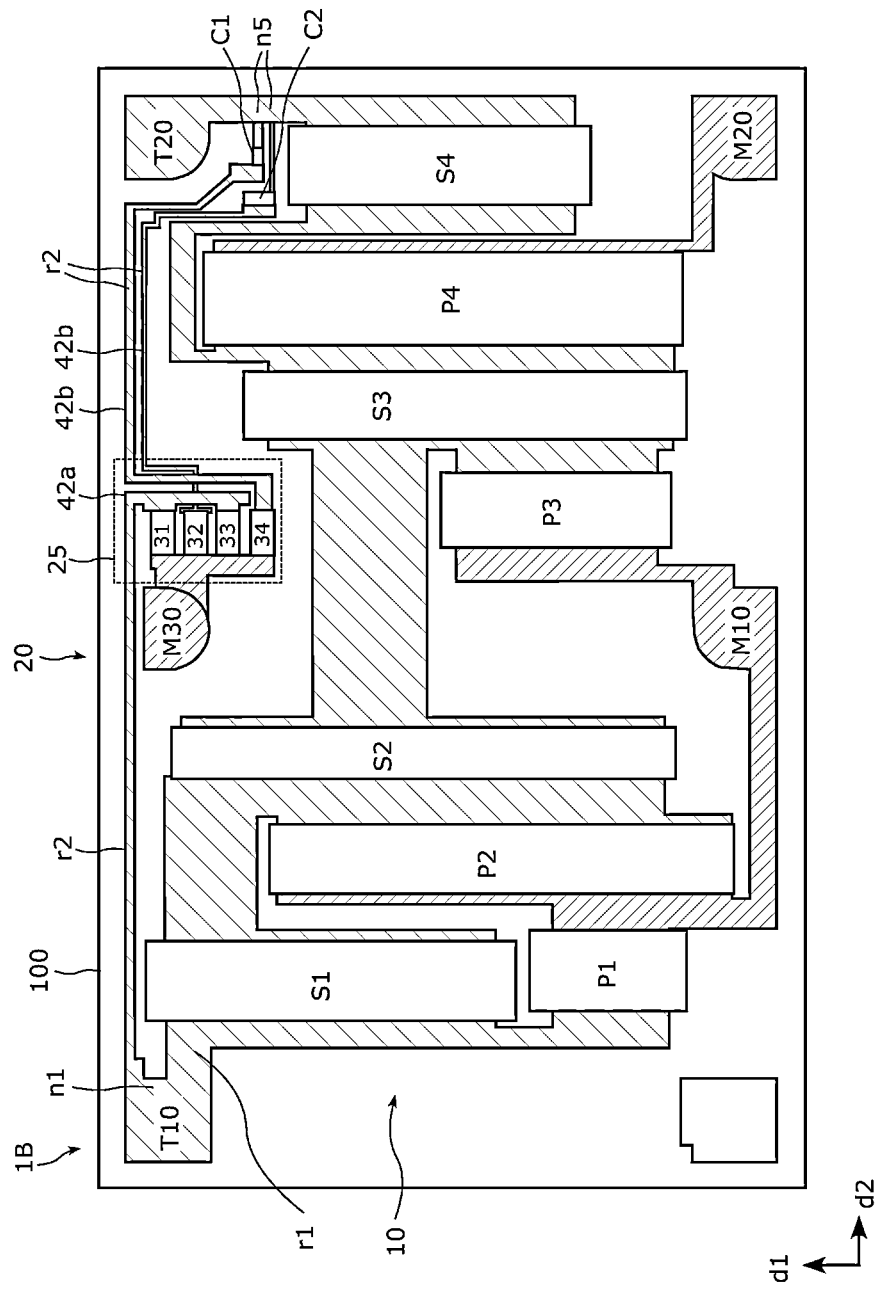
FIG. 18 is a plan view illustrating the additional circuit portion and a portion of a filter circuit portion of the high frequency filter according to the second modified example of the present invention.

FIG. 18 is a plan view illustrating the additional circuit portion 20 and a portion of the filter circuit portion 10 of the high frequency filter 1B according to the second modified example.

The first electrodes 31a to 34a are connected to the second path r2. For example, a high frequency signal is input to the first electrodes 31a and 33a from the second path r2. The first electrodes 32a and 34a output the input high frequency signal to the second path r2.

In the second modified example, the second electrodes 31b to 34b are connected to a connection conductor on a path connecting the parallel arm resonators P1 to P3 and the inductor L1. In the second modified example, a node n13 on a path connecting the connection terminal M1 and the inductor L1 is a connection conductor. The second electrodes 31b to 34b are connected to one end of the inductor L1 with the connection electrode M30 and a connection terminal M3 interposed therebetween, and are further connected to a ground terminal G1 with the inductor L1 interposed therebetween. The connection electrode M30 is not electrically connected to the connection electrode M10.

Figure 19:
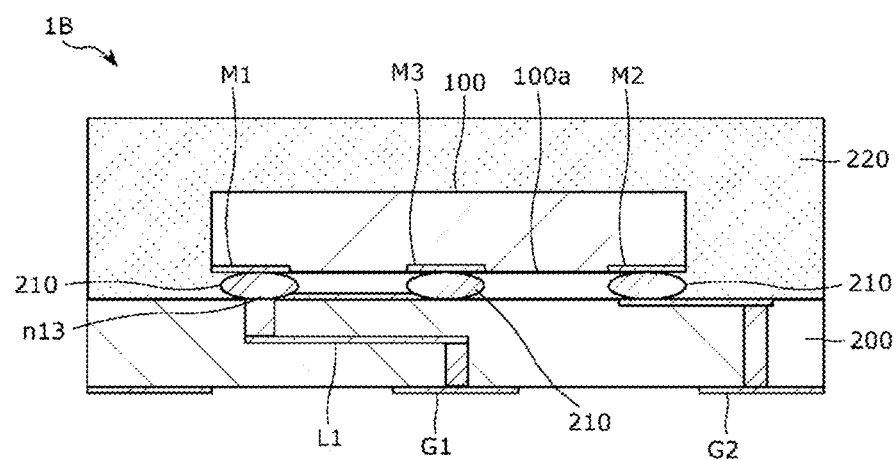
FIG. 19 is a view schematically illustrating a cross section of the high frequency filter according to the second modified example of the present invention.

FIG. 19 is a view schematically illustrating a cross section of the high frequency filter 1B according to the second modified example.

As illustrated in FIG. 19, the high frequency filter 1B includes the piezoelectric substrate 100 and the mounting substrate 200.

Other elements of the filter circuit portion 10 excluding the inductor L1 and the additional circuit portion 20 are preferably provided on the piezoelectric substrate 100 (not illustrated). The connection terminals M1, M2, and M3 are provided on a main surface 100a of the piezoelectric substrate 100. Each of the connection terminals M1, M2, and M3 is preferably bonded to the mounting substrate 200 by a bonding portion 210 such as, for example, solder, a conductive paste, etc.

The inductor L1 and the ground terminals G1 and G2 are provided on the mounting substrate 200. One end of the inductor L1 is connected to the connection terminals M1 and M3 with the wiring conductor in the mounting substrate 200 and the bonding portion 210 interposed therebetween. The connection terminal M1 is connected to the parallel arm resonators P1 to P3 described above. The connection terminal M3 is connected to the second electrodes 31b to 33b, and the connection terminal M3 is connected to one end of the inductor L1 through a wiring provided on a surface of the mounting substrate 200 and the node n13. The other end of the inductor L1 is connected to the ground terminal G1 with another wiring conductor in the mounting substrate 200 interposed therebetween. The connection terminal M2 is connected to the ground terminal G2 with the bonding portion 210 and another wiring conductor in the mounting substrate 200 interposed therebetween.

For example, a length of the inductor L1 illustrated in FIG. 19 can be shortened by reducing the inductance value of the inductor L1. As a result, a size of the high frequency filter 1B can be reduced.

As described above, the high frequency filter 1 according to the present example embodiment includes the piezoelectric substrate 100, the first signal electrode T10 and the second signal electrode T20 provided on the piezoelectric substrate 100, the filter circuit portion 10 provided on the first path r1 between the first signal electrode T10 and the second signal electrode T20, and the additional circuit portion 20 provided on the second path r2 parallel to at least a portion of the first path r1. The filter circuit portion 10 includes one or more series arm resonators S1 to S4 provided on the first path r1, one or more parallel arm resonators P1 to P4 provided on the path connecting the first path r1 and the ground, and the inductor L1 provided on the path connecting the ground and a portion or all of parallel arm resonators (for example, P1 to P3) among the one or more parallel arm resonators P1 to P4. The additional circuit portion 20 includes the acoustically coupled resonator 25 including the plurality of acoustic wave resonators. The plurality of acoustic wave resonators include the first electrodes 31a to 34a and the second electrodes 31b to 34b opposing the first electrodes 31a to 34a, respectively. The first electrodes 31a to 34a are connected to the second path r2. The second electrodes 31b to 34b are connected to the connection conductor on the path connecting a portion or all of parallel arm resonators P1 to P3 and the inductor L1.

In the high frequency filter 1 as described above, the second electrodes 31b to 34b of the IDT electrodes 31 to 34 are connected to the inductor L1. Therefore, the capacitance components of the IDT electrodes 31 to 34 can be added to the capacitance components of the parallel arm resonators P1 to P3 of the LC resonance circuit defined by the parallel arm resonators P1 to P3 and the inductor L1. Accordingly, the capacitance components in the LC resonance circuit can be increased, and conversely, inductive components can be reduced. As a result, the inductance value of the inductor L1 can be reduced.

Furthermore, by adding the capacitance components of the IDT electrodes 31 to 34 to the LC resonance circuit, the inductance value of the inductor L1 can be reduced. Therefore, in the LC resonance circuit, the C value can be increased and the L value can be reduced, and the attenuation amount can be secured in the attenuation band of the high frequency filter 1. In addition, by reducing the inductance value of the inductor L1, the resistance component of the inductor L1 can also be reduced, and the loss due to the resistance component can be suppressed. Accordingly, it is possible to suppress a decrease in the insertion loss in the pass band of the high frequency filter 1.

Furthermore, the connection conductor may be provided on the piezoelectric substrate 100.

Accordingly, the connection conductor provided on the piezoelectric substrate 100 is used, so that the second electrodes 31b to 34b of the IDT electrodes 31 to 34 can be connected to the inductor L1 with a simple structure. Thus, the capacitance components of the IDT electrodes 31 to 34 can be easily added to the capacitance components of the parallel arm resonators P1 to P3 of the LC resonance circuit, and the inductance value of the inductor L1 can be reduced. In addition, since the inductance value of the inductor L1 can be reduced, the C value in the LC resonance circuit can increase and the L value can be reduced, and the attenuation amount in the attenuation band of the high frequency filter 1 can be secured.

Furthermore, all of the second electrodes 31b to 34b of the plurality of acoustic wave resonators may be connected to the connection conductor.

Accordingly, the capacitance components of all of the IDT electrodes 31 to 34 can be added to the capacitance components of the parallel arm resonators P1 to P3 of the LC resonance circuit. Therefore, the capacitance components in the LC resonance circuit can be increased, and conversely, inductive components can be reduced. As a result, the inductance value of the inductor L1 can be reduced. In addition, by adding the capacitance components of all of the IDT electrodes 31 to 34 to the LC resonance circuit, the inductance value of the inductor L1 can be reduced. Therefore, in the LC resonance circuit, the C value can be increased and the L value can be reduced, and the attenuation amount can be secured in the attenuation band of the high frequency filter 1.

In addition, the lead-out wiring 43 connecting the second electrodes 31b to 34b and the connection conductor may include a first facing region 46 that opposes the main wiring 41 provided on the first path r1 with the dielectric layer 130 interposed therebetween.

Since the high frequency filter 1 as described above includes the first facing region 46, the capacitance component formed in the first facing region 46 can be further added to the capacitance components of the parallel arm resonators P1 to P3 in the LC resonance circuit and the IDT electrodes 31 to 34. Accordingly, the capacitance components in the LC resonance circuit can be increased, and conversely, inductive components can be reduced. As a result, the inductance value of the inductor L1 can be further reduced. The inductance value of the inductor L1 can be reduced. Therefore, in the LC resonance circuit, the C value can be increased and the L value can be reduced, and the attenuation amount can be secured in the attenuation band of the high frequency filter 1.

Furthermore, the lead-out wiring 43 connecting the second electrodes 31b to 34b and the connection conductor may include a second facing region 47 that opposes the sub wirings 42a and 42b provided on the second path r2 with the dielectric layer 130 interposed therebetween.

Since the high frequency filter 1A as described above includes the second facing region 47, the capacitance component provided in the second facing region 47 can be further added to capacitive components of the parallel arm resonators P1 to P3 in the LC resonance circuit, capacitance components of the IDT electrodes 31 to 34, and the capacitive component of the first facing region 46. Accordingly, the capacitance components in the LC resonance circuit can be increased, and conversely, inductive components can be reduced. As a result, the inductance value of the inductor L1 can be further reduced. In addition, since the inductance value of the inductor L1 can be reduced, the C value in the LC resonance circuit can increase and the L value can be reduced, and the attenuation amount in the attenuation band of the high frequency filter 1 can be secured.

Furthermore, the plurality of acoustic wave resonators of the acoustically coupled resonator 25 may be four or more acoustic wave resonators.

Accordingly, the capacitance components of four or more acoustic wave resonators can be added to the capacitance components of the parallel arm resonators P1 to P3 of the LC resonance circuit. Therefore, the capacitance components in the LC resonance circuit can be increased, and conversely, inductive components can be reduced. As a result, the inductance value of the inductor L1 can be reduced. In addition, by adding four or more acoustic wave resonators to the LC resonance circuit, the inductance value of the inductor L1 can be reduced. Therefore, in the LC resonance circuit, the C value can be increased and the L value can be reduced, and the attenuation amount can be secured in the attenuation band of the high frequency filter 1.

Furthermore, a portion or all of parallel arm resonators connected to the connection conductor may be two or more parallel arm resonators.

Accordingly, the combined capacitance of the two or more parallel arm resonators connected to the inductor L1 can increase. As a result, the inductance value of the inductor L1 can be reduced. In addition, since the inductance value of the inductor L1 can be reduced, the C value in the LC resonance circuit can increase and the L value can be reduced, and the attenuation amount in the attenuation band of the high frequency filter 1 can be secured.

Each of the plurality of acoustic wave resonators may include the IDT electrodes 31 to 34, each of the first electrodes 31a to 34a and the second electrodes 31b to 34b may be a comb-shaped electrode including a plurality of electrode fingers, and the electrode finger 36a of the first electrodes 31a to 34a and the electrode finger 36b of the second electrodes 31b to 34b may face each other in a direction perpendicular to a direction in which the electrode fingers 36a and 36b extend.

With the configuration, the capacitance components are formed by the IDT electrodes 31 to 34, and the capacitance components of the IDT electrodes 31 to 34 can be added to the capacitance components of the parallel arm resonators P1 to P3 of the LC resonance circuit defined by the parallel arm resonators P1 to P3 and the inductor L1. Accordingly, the capacitance components in the LC resonance circuit can be increased, and conversely, inductive components can be reduced. As a result, the inductance value of the inductor L1 can be reduced. In addition, since the inductance value of the inductor L1 can be reduced, the C value in the LC resonance circuit can increase and the L value can be reduced, and the attenuation amount in the attenuation band of the high frequency filter 1 can be secured.

Furthermore, the high frequency filter 1 may further include the mounting substrate 200, the piezoelectric substrate 100 may be mounted on the mounting substrate 200 by the bonding portion 210, and the inductor L1 may be provided on the mounting substrate 200.

Accordingly, the second electrodes 31b to 34b of the IDT electrodes 31 to 34 can be connected to the inductor L1 with a simple structure. Thus, the capacitance components of the IDT electrodes 31 to 34 can be easily added to the capacitance components of the parallel arm resonators P1 to P3 of the LC resonance circuit, and the inductance value of the inductor L1 can be reduced. In addition, since the inductance value of the inductor L1 can be reduced, the C value in the LC resonance circuit can increase and the L value can be reduced, and the attenuation amount in the attenuation band of the high frequency filter 1 can be secured.

Furthermore, the high frequency filter 1 may further include the cover 250 covering the piezoelectric substrate 100, and the inductor L1 may be provided on the cover 250.

Accordingly, the second electrodes 31b to 34b of the IDT electrodes 31 to 34 can be connected to the inductor L1 with a simple structure. Thus, the capacitance components of the IDT electrodes 31 to 34 can be easily added to the capacitance components of the parallel arm resonators P1 to P3 of the LC resonance circuit, and the inductance value of the inductor L1 can be reduced. In addition, since the inductance value of the inductor L1 can be reduced, the C value in the LC resonance circuit can increase and the L value can be reduced, and the attenuation amount in the attenuation band of the high frequency filter 1 can be secured.

Furthermore, the filter circuit portion 10 may be a ladder filter.

Accordingly, the combined capacitance of the parallel arm resonators connected to the inductor L1 is used, so that the inductance value of the inductor L1 can be reduced. In addition, since the inductance value of the inductor L1 can be reduced, the C value in the LC resonance circuit can increase and the L value can be reduced, and the attenuation amount in the attenuation band of the high frequency filter 1 can be secured.

The multiplexer 5 according to the present example embodiment includes the above-described high frequency filter 1, and another filter 50 having a pass band different from a pass band of the high frequency filter 1.

With the configuration, it is possible to provide the multiplexer 5 including the high frequency filter 1 that secures the attenuation amount outside the pass band, and reduces the inductance value of the inductor provided between the parallel arm resonator and the ground.

Other Example Embodiments

Hereinabove, filters and multiplexers according example embodiments of the present invention have been described using the example embodiment and the modified examples. However, the present invention also includes other example embodiments obtained by combining any component in the above-described example embodiment, the modified examples obtained by making various modifications to the above-described example embodiment that those skilled in the art can think of without departing from the gist of the present invention, or high frequency front-end circuits and communication devices that include the filter or the multiplexer according to the present invention.

In the above-described example embodiment, an example in which the acoustically coupled resonator 25 of the additional circuit portion 20 includes, for example, four IDT electrodes is described, but the present invention is not limited thereto, and the number of IDT electrodes included in the acoustically coupled resonator 25 may be, for example, two or more.

In the above-described example embodiment, an example in which the pass band of the high frequency filter 1 is set to be lower than the pass band of another filter 50 is described, but the present invention is not limited thereto, and the pass band of the high frequency filter 1 may be set to be higher than the pass band of another filter 50.

In the above-described example embodiment, an example in which the high frequency filter 1 is a transmission filter is described, but the present invention is not limited thereto, and the high frequency filter 1 may be a reception filter. In addition, the multiplexer 5 is not limited to a configuration including both the transmission filter and the reception filter, and may have a configuration including only the transmission filter or the reception filter.

Furthermore, the first signal terminal T1 and the second signal terminal T2 may be either an input terminal or an output terminal. For example, when the first signal terminal T1 is an input terminal, the second signal terminal T2 is an output terminal, and when the second signal terminal T2 is an input terminal, the first signal terminal T1 is an output terminal.

Furthermore, another filter 50 can be appropriately designed according to the required filter characteristics and the like. Specifically, another filter 50 is not limited to a ladder filter structure, and may have a longitudinally coupled filter structure. In addition, each of the resonators defining another filter 50 is not limited to a SAW resonator, and may be, for example, a BAW resonator. Moreover, another filter 50 may be configured without using a resonator, and may be, for example, an LC resonance filter or a dielectric filter.

Furthermore, materials of the electrode layer 102 and the dielectric layer 130 of the IDT electrode and the reflector are not limited to the above-described materials. In addition, the IDT electrode does not have to have the above-described stacked structure. The IDT electrode may be made of, for example, a metal or alloy such as T1, Al, Cu, Pt, Au, Ag, and Pd, or may be made of a plurality of multilayer bodies including the metals or alloys described above.

Furthermore, in the above-described example embodiment, the piezoelectric substrate 100 having piezoelectricity as a substrate is described, but the piezoelectric substrate may be a piezoelectric substrate formed of a single layer of piezoelectric layers. The piezoelectric substrate in this case includes, for example, a piezoelectric single crystal of $LiTaO_3$ or another piezoelectric single crystal such as $LiNbO_3$. In addition, the piezoelectric substrate 100 on which the IDT electrode is formed may be entirely formed of a piezoelectric layer, or may have a structure in which a piezoelectric layer is stacked on a support substrate, as long as it has piezoelectricity. Moreover, a structure in which at least one dielectric layer is stacked between the support substrate and the piezoelectric layer may be used. In addition, the cut-angle of the piezoelectric substrate 100 according to the above-described example embodiment is not limited. In other words, the stacked structure, material, and thickness may be appropriately changed in accordance with the required pass characteristics of the filter, and the same effect can be achieved even with the $LiTaO_3$ piezoelectric substrate or a surface acoustic wave filter using the $LiNbO_3$ piezoelectric substrate or the like having a cut-angle other than the cut-angle described in the example embodiment.

Example embodiments of the present invention can be widely used in communication equipment such as a mobile phone as a multiplexer having a filter, a front-end circuit, and a communication device.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency filter comprising:
a piezoelectric substrate;
a first signal electrode and a second signal electrode on the piezoelectric substrate;
a filter circuit portion on a first path between the first signal electrode and the second signal electrode; and
an additional circuit portion on a second path parallel or substantially parallel to at least a portion of the first path; wherein
the filter circuit portion includes one or more series arm resonators on the first path, one or more parallel arm resonators on a path connecting the first path and a ground, and an inductor on a path connecting the ground and a portion or all of parallel arm resonators among the one or more parallel arm resonators;
the additional circuit portion includes an acoustically coupled resonator including a plurality of acoustic wave resonators;
each of the plurality of acoustic wave resonators includes a first electrode and a second electrode opposing the first electrode;
the first electrode is connected to the second path; and
the second electrode is connected to a connection conductor on a path connecting the portion or all of parallel arm resonators and the inductor.

2. The high frequency filter according to claim 1, wherein the connection conductor is provided on the piezoelectric substrate.

3. The high frequency filter according to claim 1, wherein all of the second electrodes in the plurality of acoustic wave resonators are connected to the connection conductor.

4. The high frequency filter according to claim 1, wherein lead-out wiring connecting the second electrode and the connection conductor includes a first facing region that opposes a main wiring provided on the first path with a dielectric layer interposed therebetween.

5. The high frequency filter according to claim 1, wherein lead-out wiring connecting the second electrode and the connection conductor includes a second facing region that opposes a sub wiring provided on the second path with a dielectric layer interposed therebetween.

6. The high frequency filter according to claim 1, wherein the plurality of acoustic wave resonators of the acoustically coupled resonator are four or more acoustic wave resonators.

7. The high frequency filter according to claim 1, wherein the portion or all of parallel arm resonators connected to the connection conductor are two or more parallel arm resonators.

8. The high frequency filter according to claim 1, wherein
each of the plurality of acoustic wave resonators includes an interdigital transducer (IDT) electrode;
each of the first electrode and the second electrode is a comb-shaped electrode including a plurality of electrode fingers; and
the plurality of electrode fingers of the first electrode and the plurality of electrode fingers of the second electrode oppose each other in a direction perpendicular to a direction in which the electrode fingers extend.

9. The high frequency filter according to claim 1, further comprising:
a mounting substrate; wherein
the piezoelectric substrate is mounted on the mounting substrate by a bonding portion; and
the inductor is provided on the mounting substrate.

10. The high frequency filter according to claim 1, further comprising:
a cover covering the piezoelectric substrate; wherein
the inductor is provided on the cover.

11. The high frequency filter according to claim 1, wherein the filter circuit portion is a ladder filter.

12. A multiplexer comprising:
the high frequency filter according to claim 1; and
another filter including a pass band different from a pass band of the high frequency filter.

* * * * *